United States Patent [19]

Sakomura et al.

[11] Patent Number: 5,359,561
[45] Date of Patent: Oct. 25, 1994

[54] SEMICONDUCTOR MEMORY DEVICE

[75] Inventors: Shigetoshi Sakomura, Ohme; Kazuya Ito, Hamura; Hidetoshi Iwai; Toshiyuki Sakuta, both of Ohme; Masamichi Ishihara, Hamura, all of Japan; Tomoshi Matsumoto, deceased, late of Kochi, Japan, by Tadahiko Matsumoto, adminstrator

[73] Assignee: Hitachi, Ltd., Tokyo, Japan

[21] Appl. No.: 872,958

[22] Filed: Apr. 23, 1992

[30] Foreign Application Priority Data

Apr. 23, 1991 [JP] Japan .................... 3-091982

[51] Int. Cl.⁵ .................... G11C 7/00; G11C 29/00
[52] U.S. Cl. .................... 365/201; 365/187.07; 365/200; 365/203.06
[58] Field of Search .................... 365/200, 201, 225.7, 365/230.06, 189.07

[56] References Cited

U.S. PATENT DOCUMENTS

| | | | |
|---|---|---|---|
| 4,811,299 | 3/1989 | Miyazawa et al. | 365/200 |
| 4,860,260 | 8/1989 | Saito et al. | 365/200 |
| 4,916,700 | 4/1990 | Ito et al. | 365/201 |
| 4,918,662 | 4/1990 | Kondo | 365/200 |
| 4,991,139 | 2/1991 | Takahashi et al. | 365/201 |

Primary Examiner—Eugene R. LaRoche
Assistant Examiner—Son Dinh
Attorney, Agent, or Firm—Antonelli, Terry, Stout & Kraus

[57] ABSTRACT

A semiconductor memory device is provided which includes a plurality of data lines, at least one redundant data line, one common data line, a plurality of column switches installed between the plurality of data lines and the redundant data line and one common data line, and a column decoder for controlling the plurality of column switches. The column decoder operates to turn the column switch on. The column switch is connected to a plurality of data lines, excluding any defective data and redundant data lines during the test mode state.

10 Claims, 22 Drawing Sheets

FIG. 6B
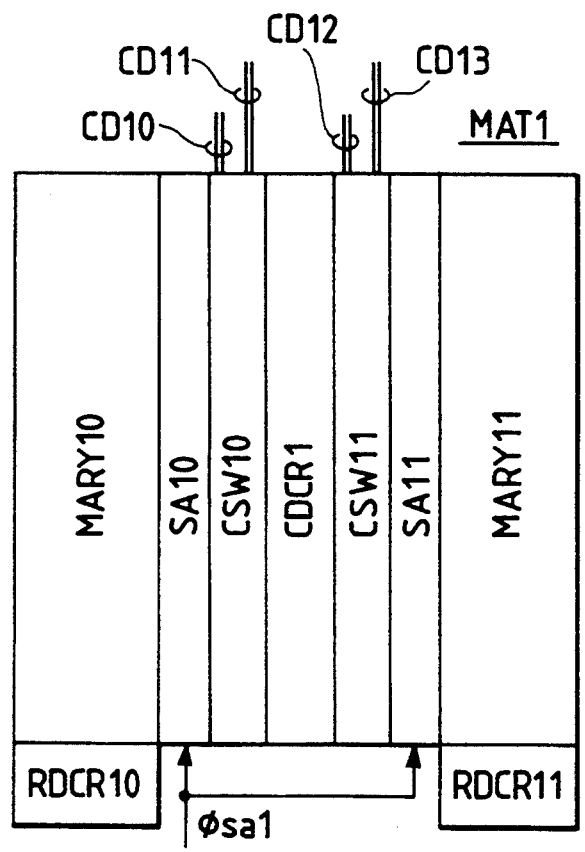
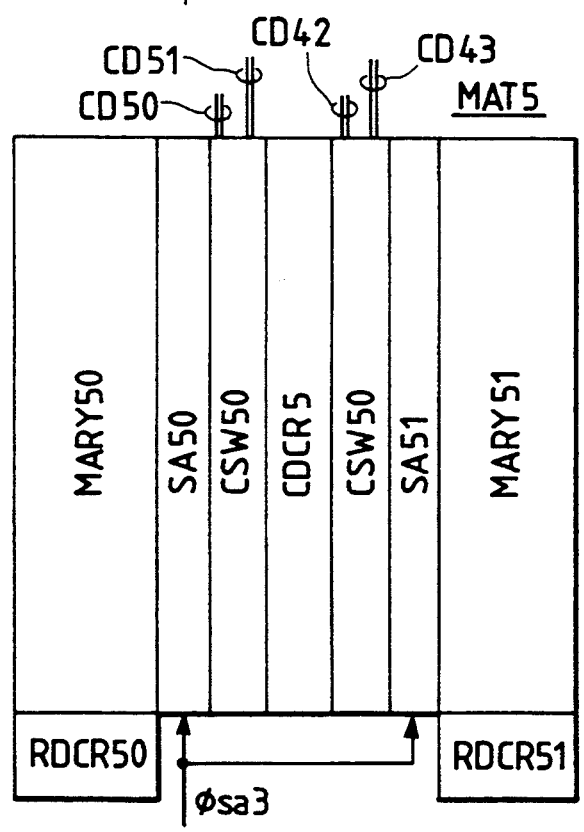

FIG. 6D
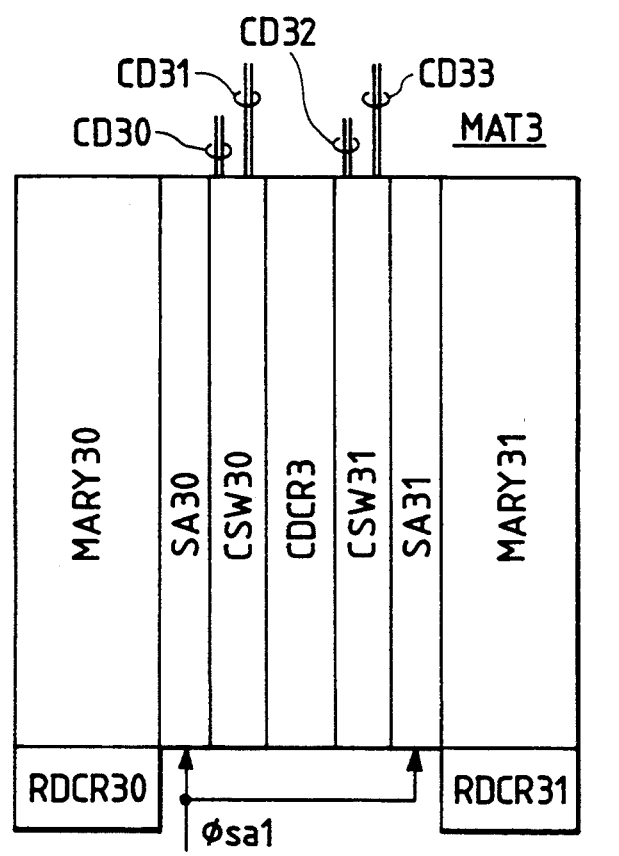
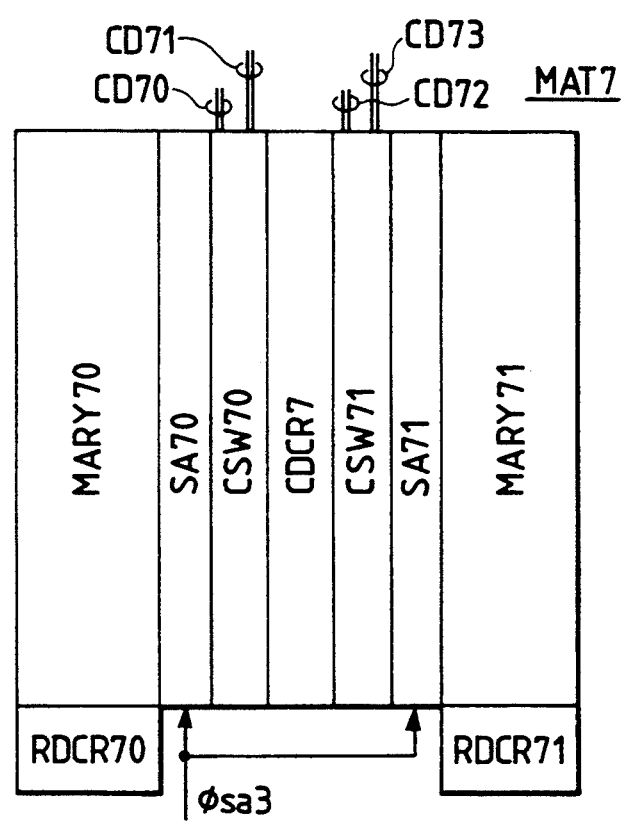

SEMICONDUCTOR MEMORY DEVICE

BACKGROUND OF THE INVENTION

The present invention relates to semiconductor devices, and more specifically to effective technology to be utilized for dynamic RAM (random access memory) having a multiple bit test function.

Regarding test circuits where a plurality of data lines corresponding to a plurality of memory cells are coupled to one common data lines whereby decisions of coincidence or non-coincidence of storage information of the plurality of memory cells coupled to one word line are carried out, and multiple bit parallel test systems using such test circuits, disclosure is seen, for example, in U.S. Ser. No. 07/228,022, Aug. 4, 1988 and U.S. Ser. No. 346,48, Jun. 12, 1989. Also regarding technology relating to dynamic RAMs containing a redundancy circuit for defect relief, disclosure is seen, for example, in U.S. Pat. No. 4,849,939, Jul. 18, 1989.

SUMMARY OF THE INVENTION

According to the studies of the inventors in a semiconductor where defective data lines are relieved by changing them to redundant data lines, it is clear that exact execution of the multiple bit parallel test is difficult by using the test circuit in the prior art. That is, defective data lines to be changed to redundant data lines are included in a plurality of data lines as objects of the multiple bit parallel test, whereby a problem occurs in that a decision result of the multiple bit parallel test to be originally decided as normal may be erroneously decided as abnormal.

An object of the present invention is to provide a semiconductor memory device having the function of relieving defect due to redundant data lines and enabling the multiple bit parallel test. Other objects of the present invention will become apparent from the description of the specification and the accompanying drawings.

An outline of the typical invention among those disclosed in the present patent application will be described as follows.

A semiconductor memory device is provided which includes a plurality of data lines, at least one redundant data line, one common data line, and a plurality of column switches installed between the plurality of data lines and the redundant data line and one common data line respectively. A column decoder is provided for controlling the plurality of column switches, the column decoder having means for turning-on the column switches to be connected to the redundant data lines and the plurality of data lines, excluding the defective data lines, and the redundant data during the test mode.

According to the above-mentioned means, using the redundant data lines, yield of products of the semiconductor memory devices can be improved and the multiple bit test mode is enabled. Thus the test time can be reduced.

BRIEF DESCRIPTION OF THE DRAWINGS

FIG. 6B is a constitution block diagram of a memory mat group 8 shown in FIG. 5;

FIG. 6D is a constitution block diagram of a memory mat group 8 shown in FIG. 5;

DESCRIPTION OF THE PREFERRED EMBODIMENTS

Figure 1:
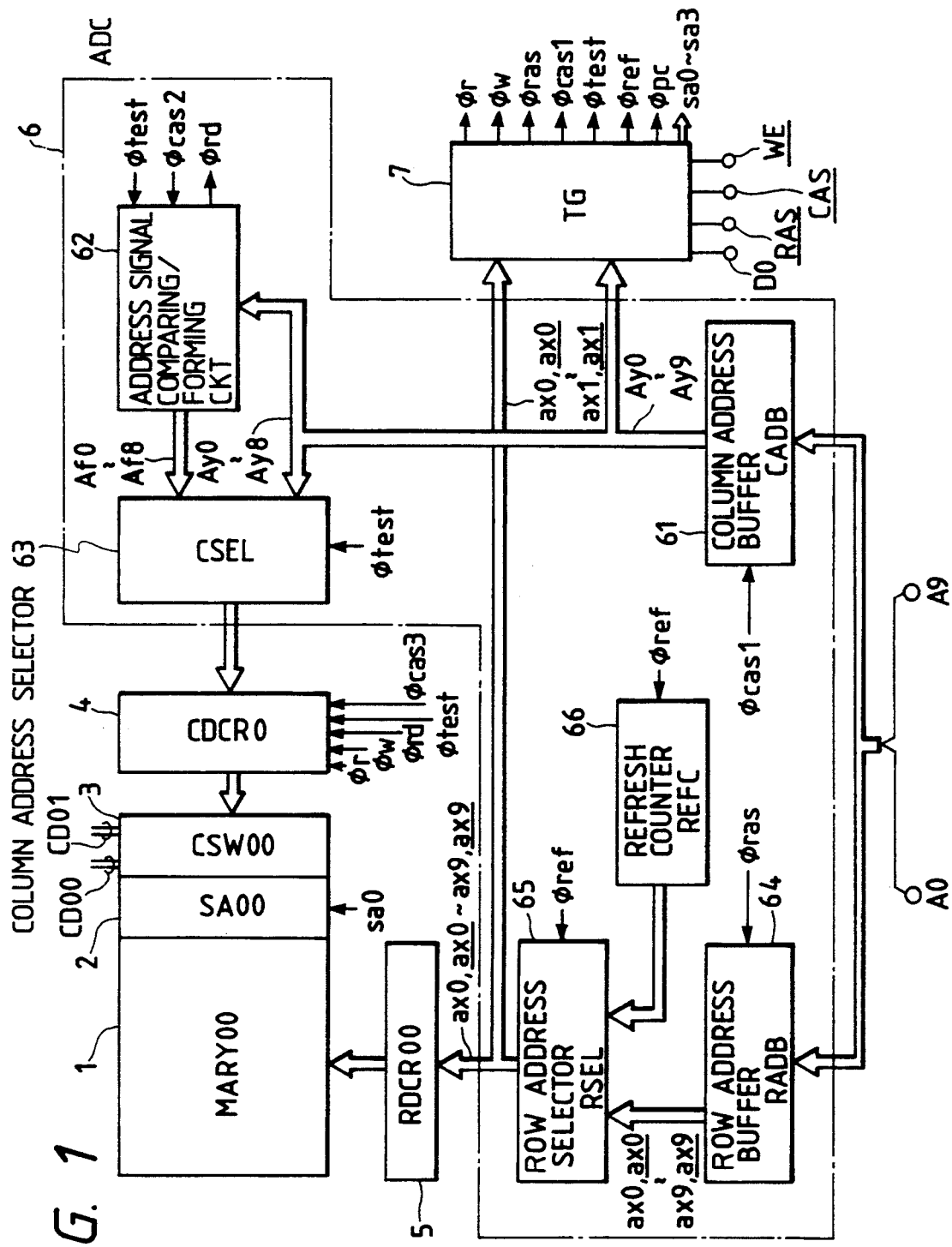
FIG. 1 is a block diagram of a memory to which the invention is applied.

FIG. 1 a circuit block diagram of a memory array section and its peripheral part of a semiconductor memory device to which the invention is applied. Each circuit element for constituting each block is formed on one semiconductor substrate such as monocrystalline silicon by known manufacturing technologies for semiconductor integrated circuits. The above-mentioned circuit elements includes MOSFETs (metal oxide semiconductor field effect transistor). Storage information of 2 bits read out of a memory array 1 constituted by dynamic memory cells is outputted through a sense amplifier 2 and a column switch 3 to common data line pair CD00, CD01 respectively. The column switch 3 is controlled by a column decoder 4 according to the present invention. External address signals to select memory cells are supplied through external address terminals A0–A9 in time series. Row address signals AX0–AX9 are taken into a row address buffer 64 in synchronization with control signal φras, and column address signals AY0–AY9 are taken into a column address buffer 61 in synchronization with control signal φcas1. A refresh counter 66 forms address signals at the refresh operation in synchronization with control signal φref. A row address selector 65 selects either output address signal of the row address buffer 64 or output address signal of the refresh counter 66, and supplies complementary address signals (ax0, $\overline{ax0}$)–(ax9, $\overline{ax9}$) of 10 bits to a row decoder 5. In this case, inverted signal is expressed by underlined signal, such as signal $\overline{ax0}$.

According to the embodiment, the external address terminals A0 and A1 may be also used as input signal terminals for setting special mode. The input signal for setting a special mode is supplied through the row address selector 65 and the column address buffer 61 to a timing generator 7. The special mode includes a multiple bit test mode according to the present invention.

Figure 15:
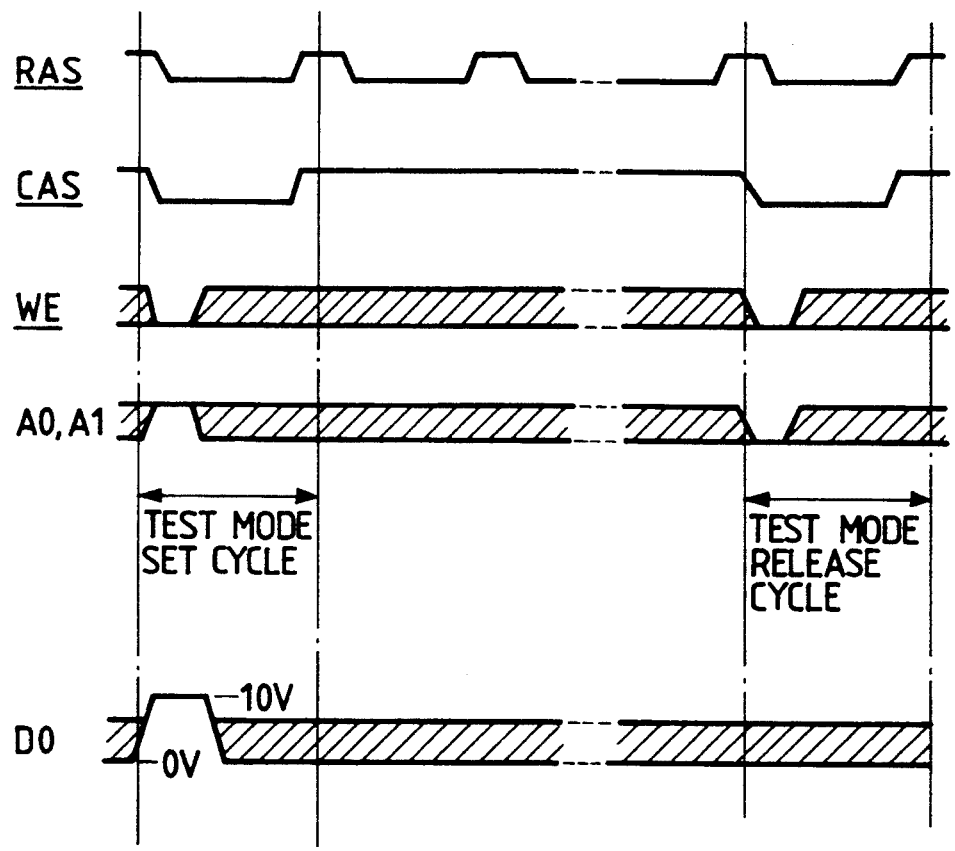
FIG. 15 is a timing chart of set and release of test mode of the invention.

FIG. 15 shows a timing chart for setting and releasing the multiple bit test mode. Setting of the multiple bit test mode is carried out at the timing of the row address strobe signal RAS falling from high level to low level, when both column address strobe signal CAS and write enable signal WE are at low level, and both external address terminals A0, A1 are at high level, and further when the external data terminal D0 is at voltage, for example, 10 V being higher than the external power source voltage Vcc. If the multiple bit test mode is set, the timing generator 7 forms test control signal φtest. Release of the multiple bit test mode is carried out at the timing of the row address strobe signal RAS falling from high level to low level, when both the column address strobe signal CAS and write enable signal WE are at low level, and both external address terminals A0, A1 are at low level.

The timing generator 7 forms read control signal φr, write control signal φw, precharge control signal φpc, sense amplifier drive signals sa0–sa3 and the like, at the usual operation mode and the multiple bit test mode. Based on row address signals AX0, AX1, any one among the sense amplifier drive signals sa0–sa3 is made the selective state of high level, for example.

In the embodiment of FIG. 1, an address signal comparing/forming circuit 62 and a column address selector 63 are installed. The address signal comparing/forming circuit 62 not only has the function of comparing whether or not column address signals Ay0–Ay8 are coincident with addresses corresponding to memory cells having defects, that is, defective address signals Af0–Af8, but also has the function of outputting the defective address signals Af0–Af8. The column address selector 63 selectively transmits the column address signals Ay0–Ay8 to the column decoder 4 at the usual read or write operation state, and transmits the defective address signals Af0–Af8 thereto at the multiple bit test mode state according to the present invention.

Figure 2:
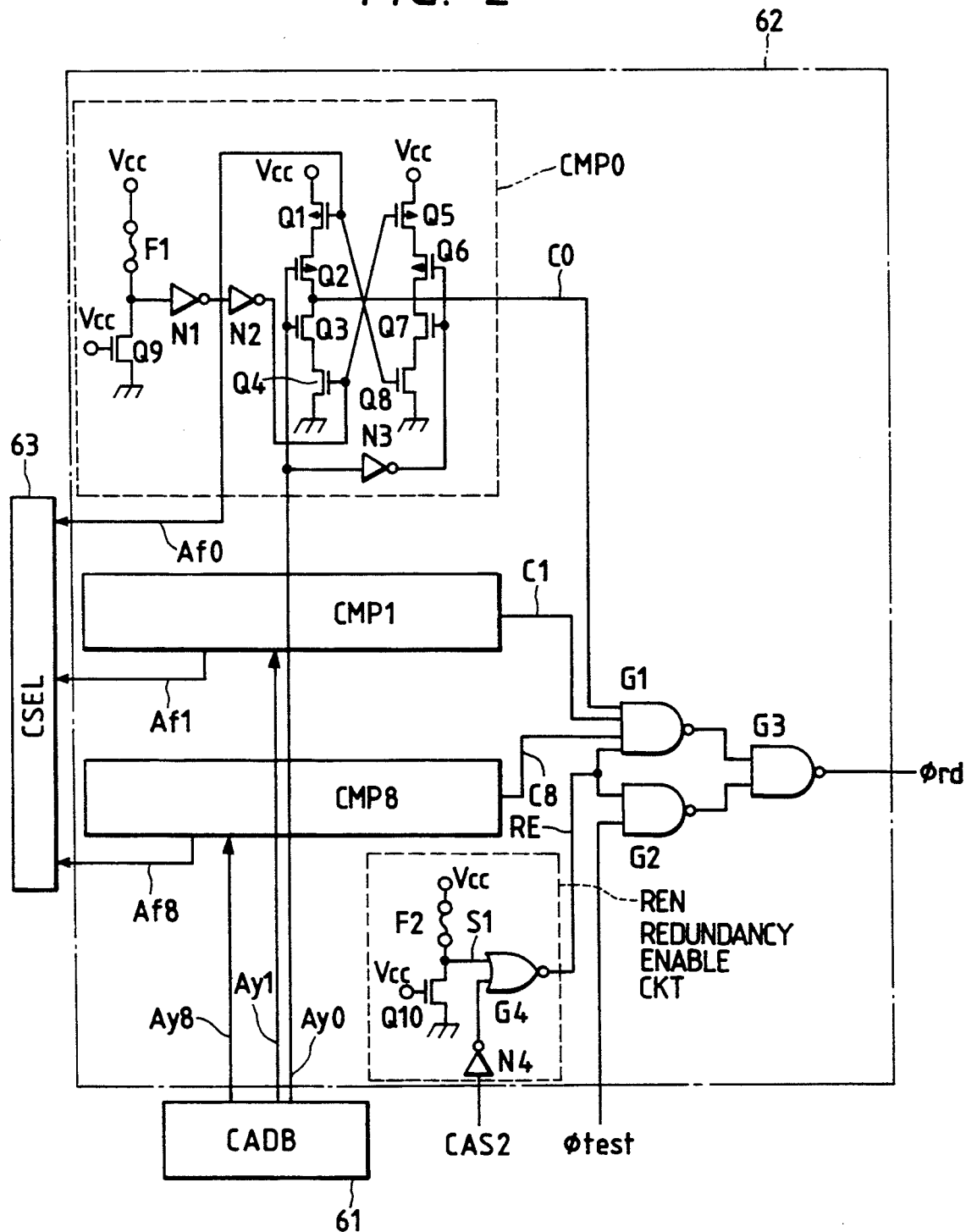
FIG. 2 is a circuit diagram of an address signal comparing/forming circuit 62 shown in FIG. 1.

FIG. 2 shows an internal circuit of the address signal comparing/forming circuit 62 shown in FIG. 1. The column address signals Ay0–Ay8 are compared with the defective address signals Af0–Af8 by a plurality of unit comparators CMP0–CMP8. Internal constitution of each unit comparator is exemplified by the unit comparator CMP0. That is, each unit comparator is provided therein with a fuse F1 and a MOSFET Q9 to constitute a circuit for storing defective address signal Af0, MOSFETs Q1–Q8 to constitute a comparator for comparing the defective address signal Af0 with the column address signal Ay0, an inverter N1 to constitute an output buffer for outputting the defective address signal Af0, and the like. If the column address signals Ay0–Ay8 are coincident with the defective address signals Af0–Af8 entirely, output signals C0–C8 of respective unit comparators are all set to the made high level state.

The address signal comparing/forming circuit 62 in FIG. 2 further comprises therein a redundancy enable circuit REN for forming redundancy enable signals RE indicating existence of data lines to be saved, (i.e., replaced) and gate circuits G1–G3 for forming redundant data line selecting signals φrd. In the redundancy enable circuit REN, the circuit constituted by the fuse F2 and the MOSFET Q10 forms indication signals S1 regarding whether the redundant addresses are stored in the unit comparators CMP0–CMP8 or not. The redundancy enable signal RE is formed based on control signal φcas2 formed based on the control signal φcas1 and the indication signal S1.

That is, at when level of the indication signal S1 is low level state indicating redundant address storage state and the timing signal φcas2 is at high level state, a NOR gate G4 forms the redundant enable signal RE of high level. The output signals C0–C8 of respective unit comparators are all made high level state and the redundant enable signal RE is made high level state, thereby a NAND gate G1 forms an output signal of low level. Consequently, the NAND gate G3 having this signal as one input signal renders the redundant data line selecting signal φrd being its output signal to high level state, i.e., to the selective state.

In the normal mode to perform usual reading or writing, the redundant data line selecting signal φrd is formed as above described. In the multiple bit test mode according to the present invention, the redundant data line selecting signal φrd of high level is formed, based on the test control signal φtest of high level indicating the multiple bit test mode and the redundancy enable signal RE of high level indicating existence of data lines to be saved. That is, the NAND gate G2 forms other input signal of the NAND gate G3, based on the test control signal φtest and the redundant data line selecting signal φrd only, irrespective of level of the output signals C0–C8 of the respective unit comparators.

Figure 3:
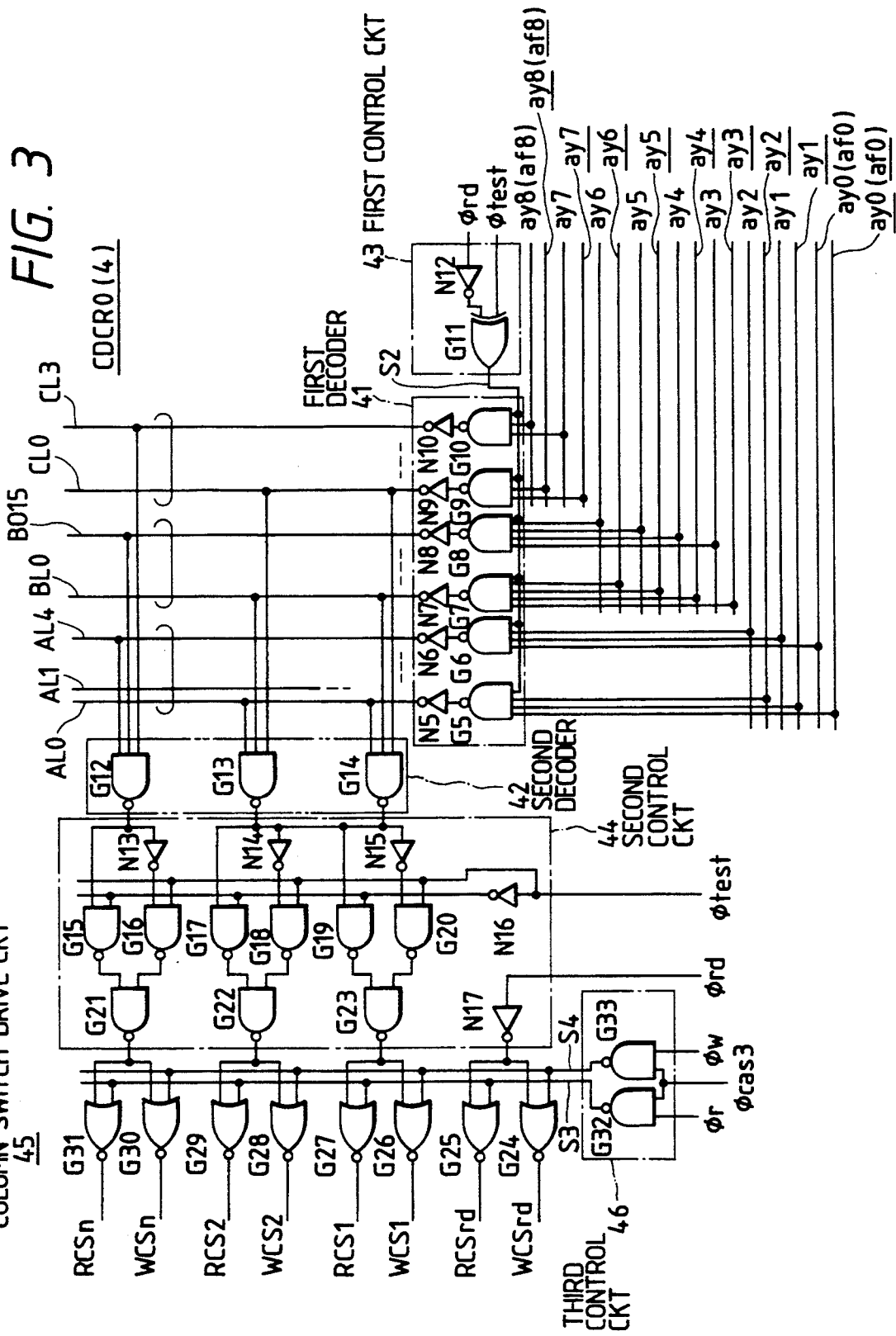
FIG. 3 is an inner logic diagram of a column decoder 4 shown in FIG. 1.

FIG. 3 shows an embodiment of a column decoder 4 (CDCRO9 shown in FIG. 1. Complementary column address signals (ay0, $\overline{ay0}$)–(ay8, $\overline{ay8}$) formed based on the column address signals Ay0–Ay8 or complementary deficient address signals (af0, $\overline{af0}$)–(af8, $\overline{af8}$) formed based on the deficient address signals Af0–Af8 are supplied to the column decoder 4 from the column selector 63 selectively. The column decoder 4 performs an operation corresponding to four sorts of operation modes in response to values of the redundant data line selecting signal φrd and the test control signal φtest.

The first mode is a mode where changing to redundant data lines is not carried out and usual read or write operation is carried out. In this mode, both the redundant data line selecting signal φrd and the test control signal φtest are made low level.

In the first operation mode, since it is an operation mode in the case that no defective line exists, changing to redundant data lines is not carried out and usual read or write operation is carried out. The complementary column address signals (ay0, $\overline{ay0}$)–(ay8, $\overline{ay8}$) are supplied to the column decoder 4. NAND gates G5–G10 to constitute a first decoder 41 receive the complementary column address signals (ay0, $\overline{ay0}$)–(ay8, $\overline{ay8}$) and a control signal S2 from a first control circuit 43. Output signals of the NAND gates G5–G10 are inverted by inverters N5–N10, thereby output signals of the first decoder 41 are formed. The output signal lines of the first decoder 41 are constituted by first output signal line group AL0–AL7, second output signal line group BL0–BL15, and third output signal line group CL0–CL3.

The first control circuit 43 is constituted by an inverter N12 for inverting the redundant data line selecting signal $\phi r$, and an exclusive OR gate G11 having the output signal of the inverter N12 and the test control signal $\phi$test as its input signals. Consequently, in the first operation mode, the control signal S2 being the output signal of the exclusive OR gate G11 is made high level. Therefore, the output signals of the NAND gates G5–G10 are set based on level of the complementary column address signals (ay0, $\overline{ay0}$)–(ay8, $\overline{ay8}$). In other words, based on the column address signals Ay0–Ay2 of 3 bits, one output signal line selected among the first output signal line group AL0–AL7 is made high level. Also based on the column address signals Ay3–Ay6 of 4 bits, one output signal line selected among the second signal line group BL0–BL15 is made high level. Further, based on the column address signals Ay7–Ay8 of 2 bits, one output signal line selected among the third output signal line group CL0–CL3 is made high level.

NAND gates G12–G14 to constitute a second decoder 42 form 512 output signals based on the column address signals Ay0–Ay8 of 9 bits, by decoding signals on the 28 output signal lines of the first decoder 41. That is, one output signal line among the 512 output signal lines of the second decoder 42 is made low level selectively. The output signal of the second decoder 42 is supplied through a second control circuit 44 to a column switch drive circuit 45.

The second control circuit 44 is constituted by a plurality of NAND gates G15–G23 and inverters N13–N17, and is controlled by the redundant data line selecting signal $\phi$rd and the test control signal $\phi$test. Each of the gate circuits G15, G17 and G19 having the output signal of the second decoder 42 as its one input signal is supplied with an inverted signal of the test control signal $\phi$test as other input signal.

In the first operation mode, since the test control signal $\phi$test is made low level, the output signal of the inverter N16 is made high level. Consequently, inverted signals of output signals of the second decoder 42 are outputted from the gate circuits G15, G17 and G19.

The gate circuits G16, G18 and G20 are supplied with output signals of the inverters N13, N14 and N15 being inverted signals of output signals of the second decoder 42 as respective one input signals, and also supplied with the test control signal $\phi$test (low level) in original condition as other input signals. Therefore, the output signals of the gate circuits G16, G18 and G20 are all made high level. Consequently, the gate circuits G21, G22 and G23 having output signals of the gate circuits G15, G17 and G19 as respective one input signals and having output signals of the gate circuits G16, G18 and G20 as other input signals form inverted signals of the outputs of the gate circuits G15, G17 and G19 respectively. That is, in the first operation mode, the output signal of the second decoder 42 in original condition is supplied to a column switch drive circuit 45. In the first operation mode, since the redundant data line selecting signal $\phi$rd is made low level, the output signal of the inverter N17 is made high level.

The column switch drive circuit 45 comprises NOR gates G27, G29 and G31 for forming read column switch selecting signals RCS1–RCSn, NOR gates G26, G28 and G30 for forming write column switch selecting signals WCS1–WCSn, a NOR gate 25 for forming a column switch selecting signal RCSrd to read redundant data lines, and a NOR gate 24 for forming a column switch selecting signal WCSrd to write redundant data lines. The column switch drive circuit 45 carries out a selection operation to form read column switch selecting signals RCS1–RCSn, RCSrd or to form write column switch selecting signals WCS1–WCSn, WCSrd, based on an output signal of a third control circuit 46.

The third control circuit 46 comprises a NAND gate 32 with the read control signal $\phi r$ applied to one input terminal, and a NAND gate 33 with the write control signal $\phi w$ applied to one input terminal. Other terminals of the NAND gates G23 and G33 are supplied with a timing signal $\phi$cas3 formed based on the control signal $\phi$cas1. Consequently, at the reading state (when the read control signal $\phi r$ is at high level), the output signal S3 of the NAND gate G32 is made low level at the timing of high level of the timing signal $\phi$cas3. Also at the writing state (when the write control signal $\phi w$ is at high level), the output signal S4 of the NAND gate G33 is made low level at the timing of high level of the timing signal $\phi$cas3.

The output signal S3 is applied to one input terminal of NOR gates G25, G27, G29 and G31 in the read system, respectively, and the output signal S4 is applied to one input terminal of NOR gates G24, G26, G28 and G30 in the write system, respectively. Also the output signal of the NAND gate G23 is commonly applied to other input terminal of the NOR gates G26, G27, and the output signal of the NAND gate G22 is commonly applied to other input terminal of the NOR gates G28, G29, and the output signal of the NAND gate G21 is commonly applied to other input terminal of the NOR gates G30, G31, and further the output signal of the inverter N17 is commonly applied to other input terminal of the NOR gates G24, G25 installed to select redundant data lines.

In the first operation mode, since the output of the inverter N17 is high level, selecting signal (RCSrd, WCSrd) to control the column switch coupled with redundant data lines is set at a non-selection state of low level. Also in the first operation mode, one of the selecting signals (RCS1–RCSn, WCS1–WCSn) to control the column switch coupled with normal data lines is set at a selection state of high level.

Next, the second operation mode is a mode where changing to redundant data lines is carried out and normal read or write operation is carried out. In this mode, the redundant data line selecting signal $\phi$rd is made high level and the test control signal $\phi$test is made low level.

In the second operation mode, since the control signal S2 being output signal of the exclusive OR gate G11 is made low level, unlike the case of the first operation mode, the output signals of the NAND gates G5–G10 are all made high level. Consequently, the output signals of the first decoder 41 are all set at the non-selection state of low level, and corresponding to this, the output signals of the second decoder 42 are all made high level. In this case, since the test control signal $\phi$test is made low level, the output signal of the second decoder 42 in original condition is supplied to the column switch drive circuit 45 in similar manner to the case of the first operation mode. Consequently, the selecting signals (RCS1–RCSn, WCS1–WCSn) for the column switch coupled with normal data lines are all set at the non-selection state of low level. Also, the output signals of the inverter N17 to constitute the second control circuit are made low level, unlike the case of the first operation mode. Consequently, one of the selecting signals (RCSrd, WCSrd) for the column switch coupled with redundant data lines is set at the selection state of high level.

Next, the third operation mode is a mode where changing to redundant data lines is not carried out and the multiple bit test operation is carried out. In this mode, the redundant data line selecting signal $\phi rd$ is made low level, and the test control signal $\phi test$ is made high level.

In the third operation mode, since the control signal S2 being an output signal of the exclusive OR gate G11 is made low level, in a similar manner to the case of the second operation mode, the output signals of the first decoder 41 are all set at the non-selection state of low level, and corresponding to this, the output signals of the second decoder 42 are all made high level. In this case, since the test control signal $\phi test$ is made high level, the inverted signals of the output signals of the second decoder 42 are supplied to the column switch drive circuit 45 unlike the case of the first and second operation modes. That is, the output signals of the NAND gates G21, G22 and G23 of the second control circuit 44 are all made low level. In this case, one of the output signals S3 and S4 in the third control circuit is made low level, thereby the selecting signals (RCS1-RCSn) or (WCS1-WCSn) for the column switch coupled with normal data lines are all set at the selection state of high level. Also since the output of the inverter N17 is high level, in a similar manner to the case of the first operation mode, the selecting signals (RCSrd, WCSrd) to control the column switch coupled with redundant data lines are set at the non-selection state of low level.

Next, the fourth operation mode is a mode where changing to redundant data lines is carried out and the multiple bit test operation is carried out. In this mode, both the redundant data line selecting signal $\phi rd$ and the test control signal $\phi test$ are made high level.

The fourth operation mode is an operation mode where defective data lines exist and a plurality of data lines excluding the redundant data lines are simultaneously selected. In order to assign the defective data lines, complementary defective address signals (af0, $\overline{af0}$)–(af8, $\overline{af8}$) are supplied from the column selector 63 to the first decoder 41 of the column decoder 4.

In the fourth operation mode, the control signal S2 being the output signal of the first control circuit 43 is made high level in similar manner to the case of the first operation mode. Consequently, the output signals of the NAND gates G5-G10 are set based on the level of the complementary defective column address signals (af0, $\overline{af0}$)–(af8,$\overline{af8}$). In other words, based on the column address signals Af0-Af2 of 3 bits, one output signal line selected among the first output signal line group AL0-AL7 is made high level. Also based on the column address signals Af3-Af6 of 4 bits, one output signal line selected among the second output signal line group BL0-BL15 is made high level. Further based on the column address signals Af7-Af8 of 2 bits, one output signal line selected among the third output signal line group CL0-CL3 is made high level.

In response to this, one output signal line among the 512 output signal lines of the second decoder 42 is selectively made low level. The output of the second decoder 42 indicates the position of the defective data lines. The output signals of the second decoder 42 are inverted by the second control circuit 44 and supplied to the column switch drive circuit 45, whereby a plurality of normal data lines only can be simultaneously selected. In other words, the selecting signals (RCS1-RCSn) or (WCS1-WCSn) for the column switch coupled with the normal data lines, excluding the selecting signals for the column switch coupled with the defective data lines, are all set at the selection state of high level.

Also the output signal of the inverter N17 to constitute the second control circuit is made low level in similar manner to the case of the second operation mode. Consequently, when the output signal S3 or S4 of the third control circuit is made low level, the selecting signal RCSrd or WCSrd to control the column switch coupled with the redundant data lines is set at the selection state of high level. Thus in the fourth operation mode, a plurality of normal data lines, excluding defective data lines, can be selected simultaneously. Consequently, in a memory including defective data lines, the multiple bit simultaneous test can be exactly performed. Further since the redundant data lines changed from the defective data lines are also selected simultaneously, the multiple bit simultaneous test including the redundant data lines can be performed.

Figure 4:
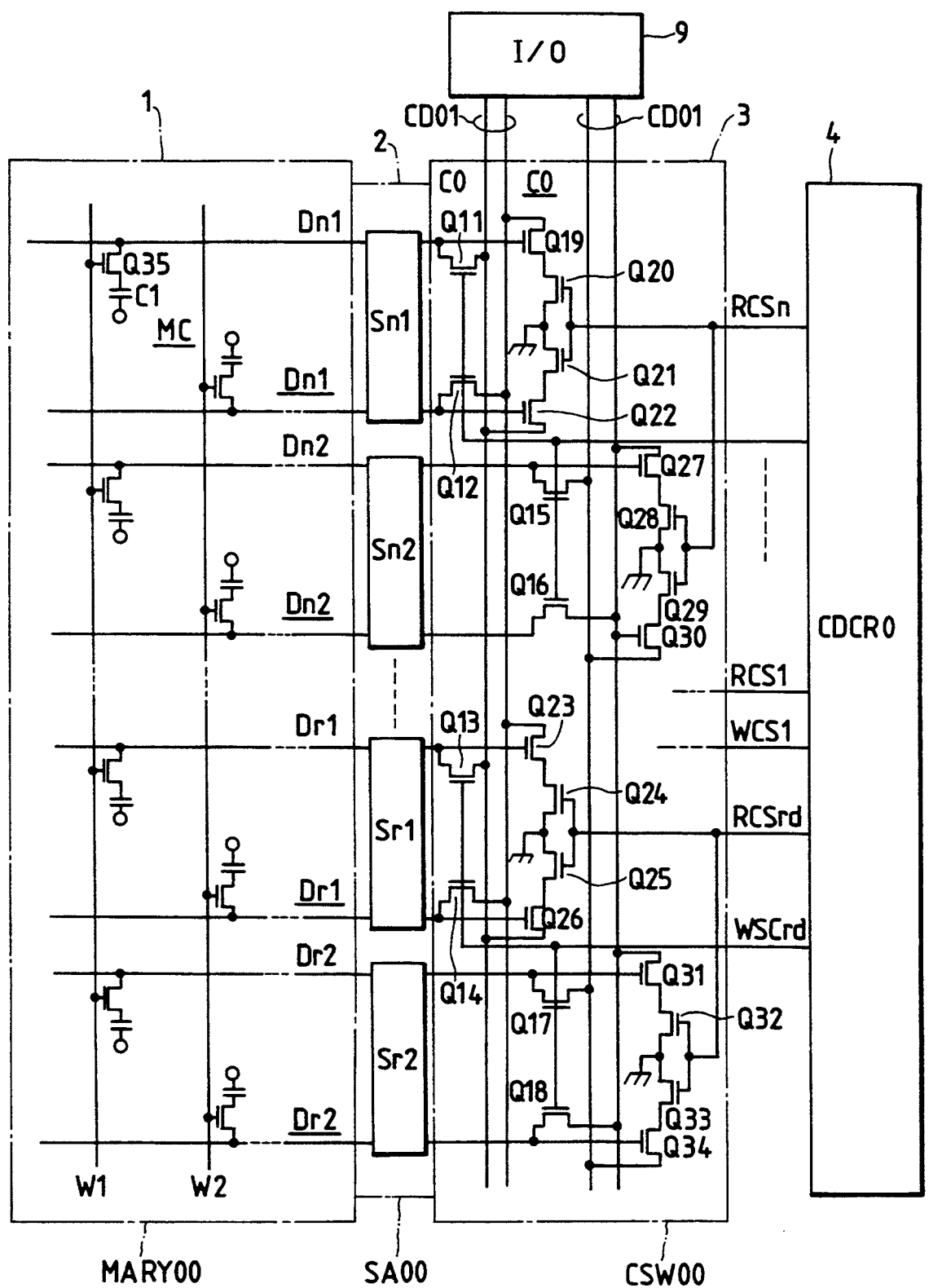
FIG. 4 is an inner circuit diagram of a column switch 3 and its peripheral block shown in FIG. 1.

FIG. 4 shows internal circuits of a column switch CSW00 (3) shown in FIG. 1 and peripheral circuits thereof. A memory cell array MARY00 (1) includes two redundant data line pairs (Dr1, $\underline{Dr1}$) and (Dr2, $\underline{Dr2}$), and 2n pairs of normal data lines with the n-th two data line pairs expressed by (Dn1, $\underline{Dn1}$) and (Dn2, $\underline{Dn2}$). On intersection portions between each data line and the word lines W1, W2 a switch MOSFET Q35 and a memory cell MC including a capacitor C1 are respectively installed. Sense amplifiers Sr1, Sr2, Sn1, Sn2 for amplifying very small complementary signals read out of the memory cell are installed on each data line pair.

In this embodiment, two common data line pairs CD00 and CD01 are installed. The first common data line pair CD00 is coupled with, for example, data line pairs (Dn1, $\underline{Dn1}$), (Dr1, $\underline{Dr1}$) arranged at the order of odd numbers from the end, among the data line pairs arranged within the memory array. The second common data line pair CD01 is coupled with, for example, data line pairs (Dn2, $\underline{Dn2}$), (Dr2, $\underline{Dr2}$) arranged at the order of even numbers among the data line pairs arranged within the memory array. The column switch 3 comprises reading switches MOSFETs Q19–Q34 for transmitting the read signal from each data line pair to an input/output circuit I/O (9), and writing switches MOSFETs Q11–Q18 for transmitting the write signal from the input/output circuit I/0 (9) to each data line pair.

One output signal of the column decoder 4, for example, reading control signal RCSn is applied commonly to gates of the reading switches MOSFETs (Q20, Q21) and (Q28, Q29) corresponding to the two neighboring data line pairs (Dn1, $\underline{Dn1}$) and (Dn2, $\underline{Dn2}$). Also regarding writing control signals, for example, writing control signal WCSn is applied commonly to gates of the writing switches MOSFETs (Q11, Q12) and (Q15, Q16) corresponding to the two neighboring data line pair (Dn1, $\underline{Dn1}$) and (Dn2, $\underline{Dn2}$).

Consequently, the normal read and write operations are carried out for the two neighboring data lines simultaneously. That is, at the normal read mode, the read data of 2 bits read out of the memory cell array 1 are sent through the common data line pairs CD00 and CD01 to the input/output circuit 9. Also at the normal write mode, the write data of 2 bits are sent through the common data line pairs CD00 and CD01 to the memory cell array Also in the multiple bit test mode, the complementary read signals of maximum n bits are transmitted to the common data line pairs CD00 and CD01 respectively. As a result, the simultaneous test of maximum 2n bits becomes possible. Data written before the multiple bit simultaneous reading are made 1 or 0 in the whole bits.

Figure 5:
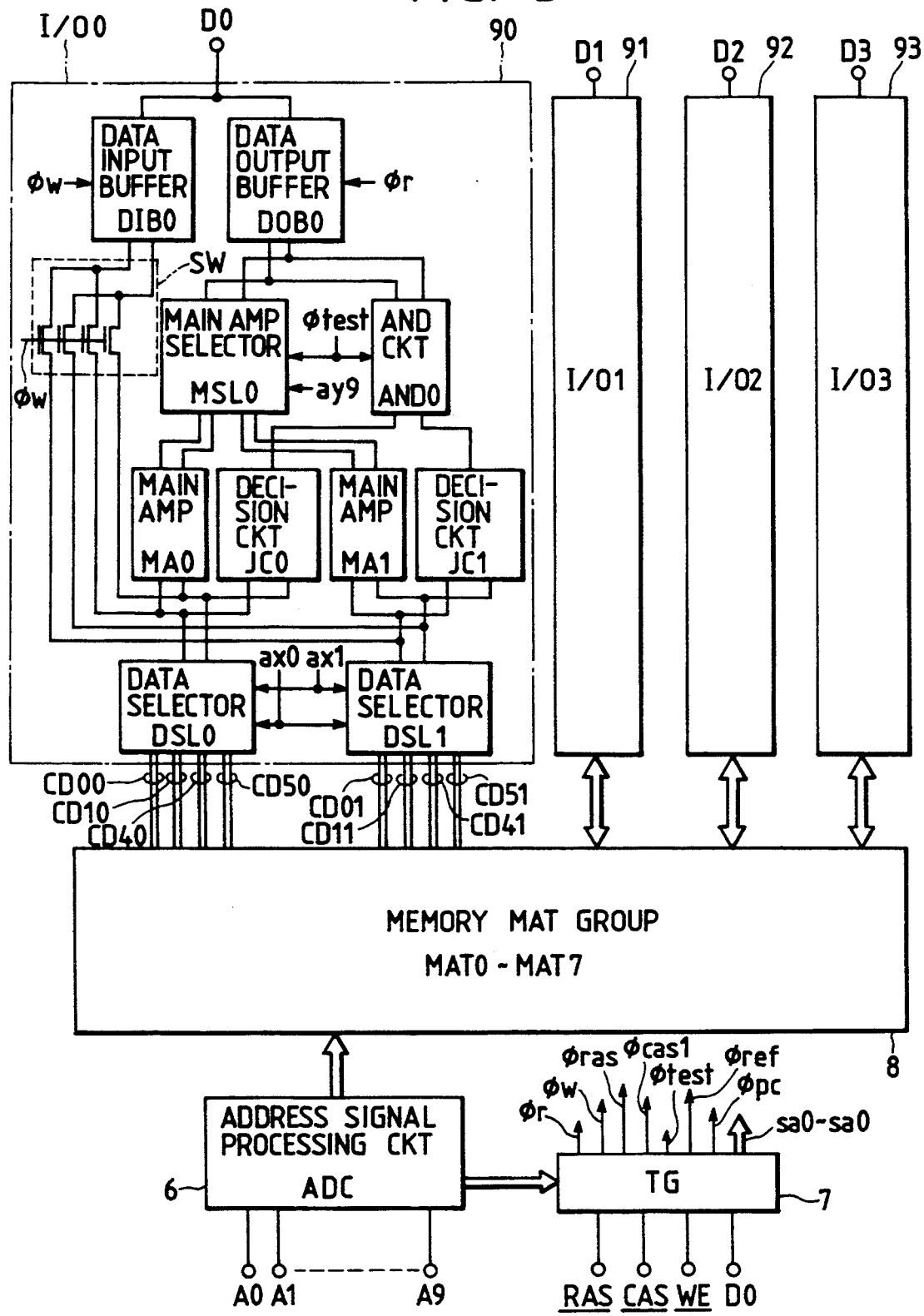
FIG. 5 is a block diagram of a memory to which the invention is applied.
Figure 6A:
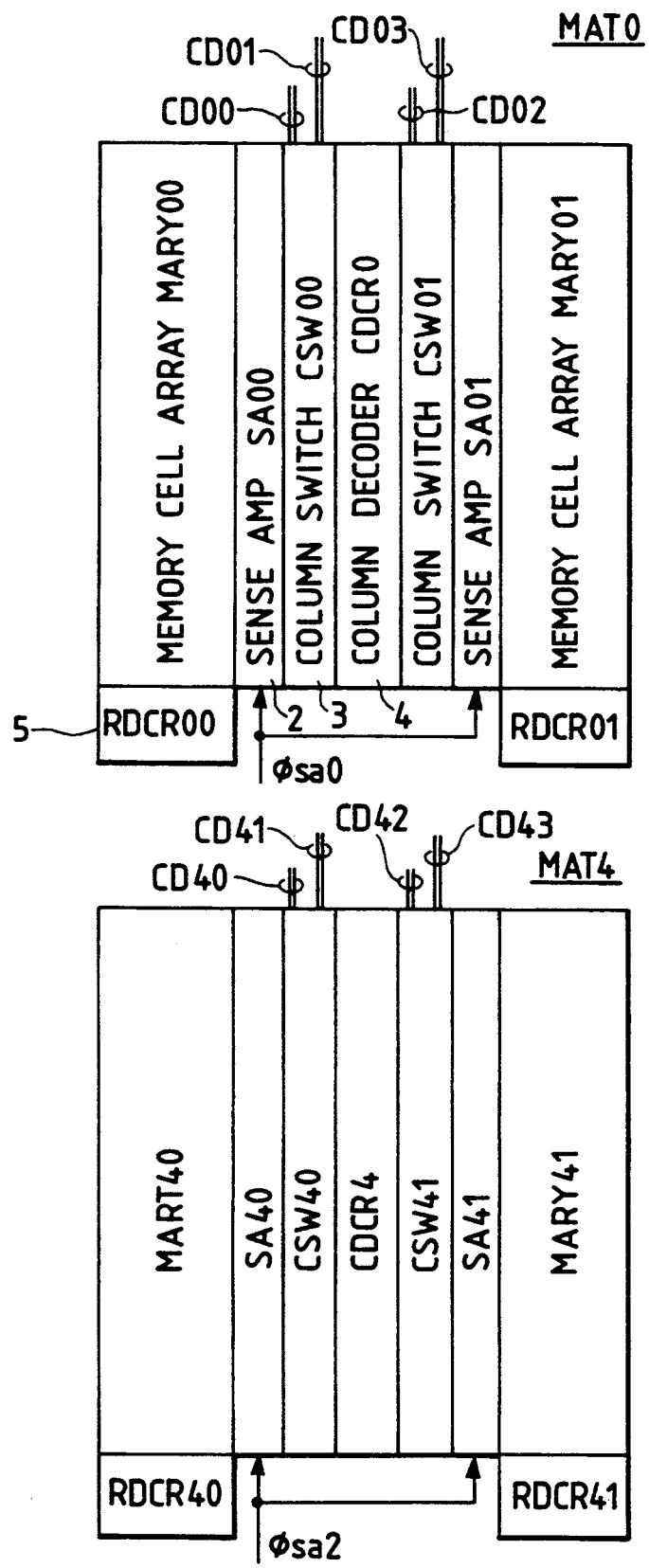
FIG. 6A is a constitution block diagram of a memory mat group 8 shown in FIG. 5.
Figure 6C:
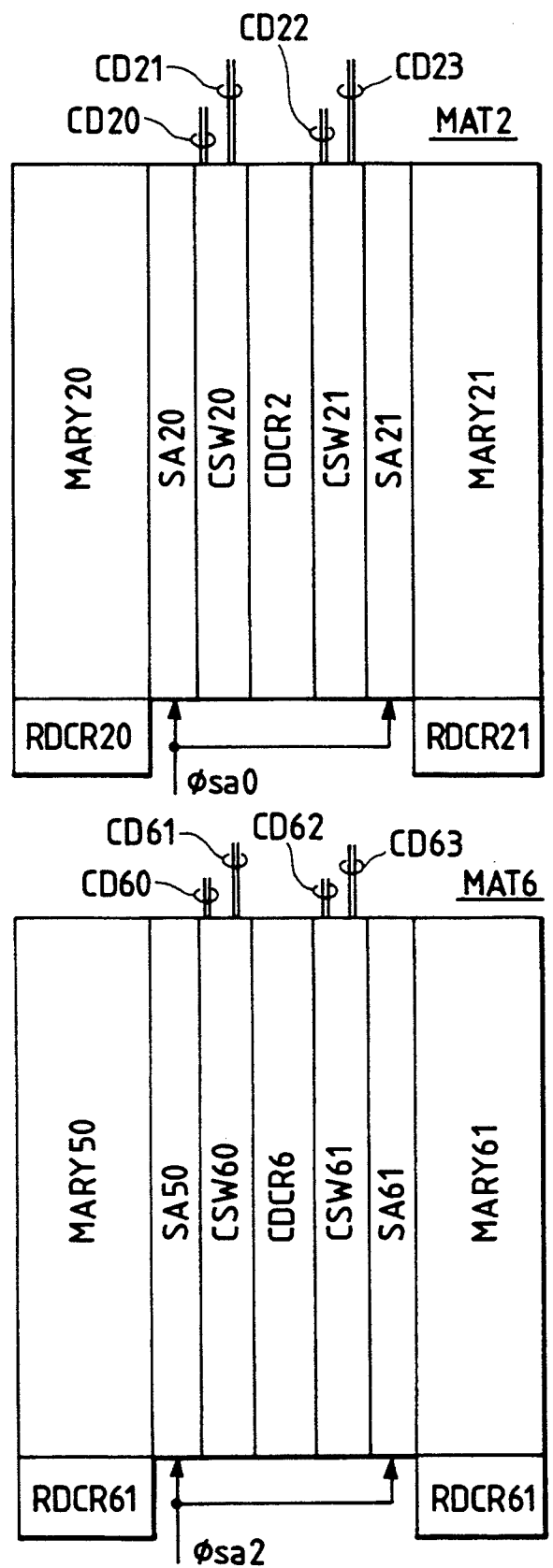
FIG. 6C is a constitution block diagram of a memory mat group 8 shown in FIG. 5.
Figure 7A:
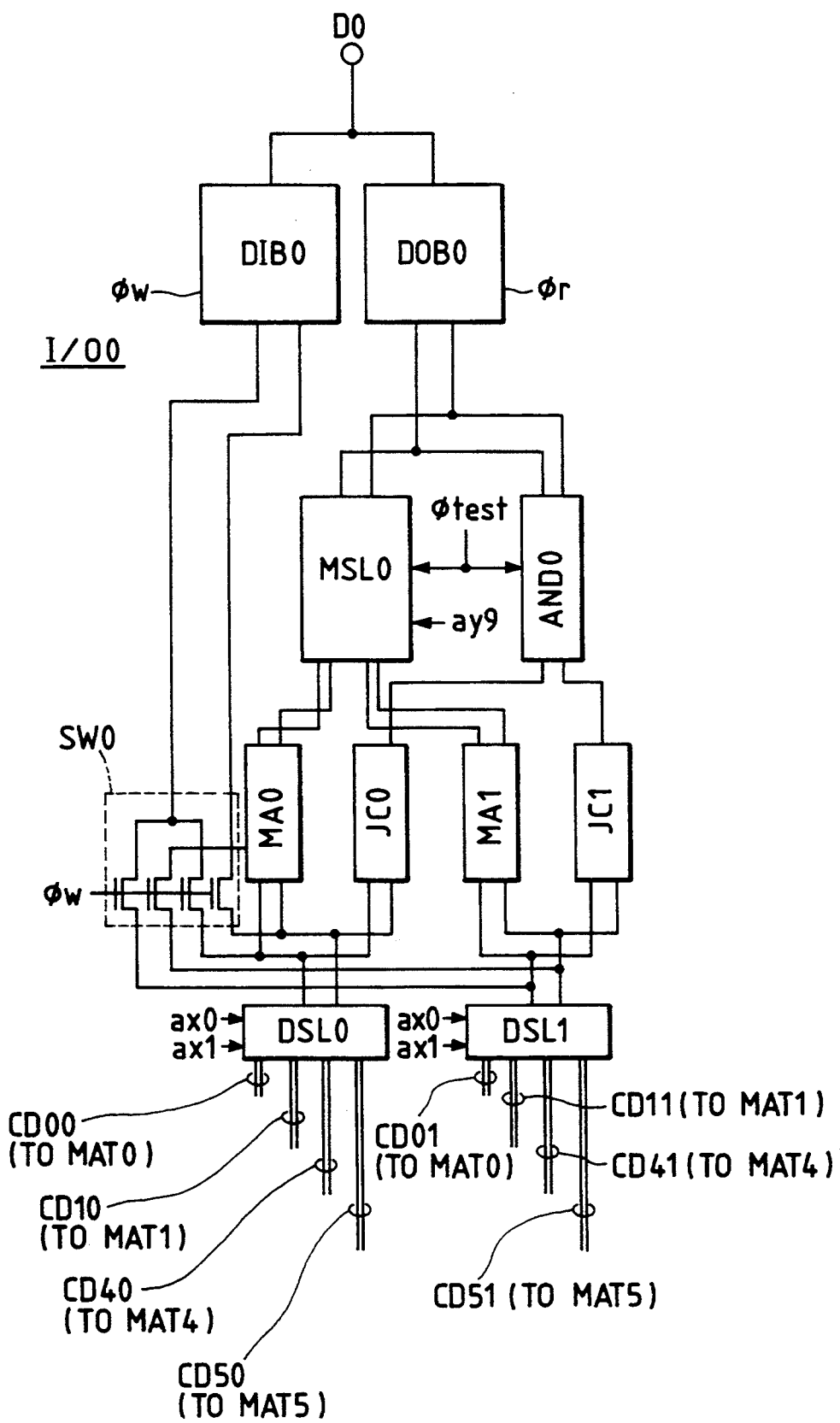
FIG. 7A is a connection diagram between an input-/output circuit 90 and a memory mat group 8 shown in FIG. 5.
Figure 7B:
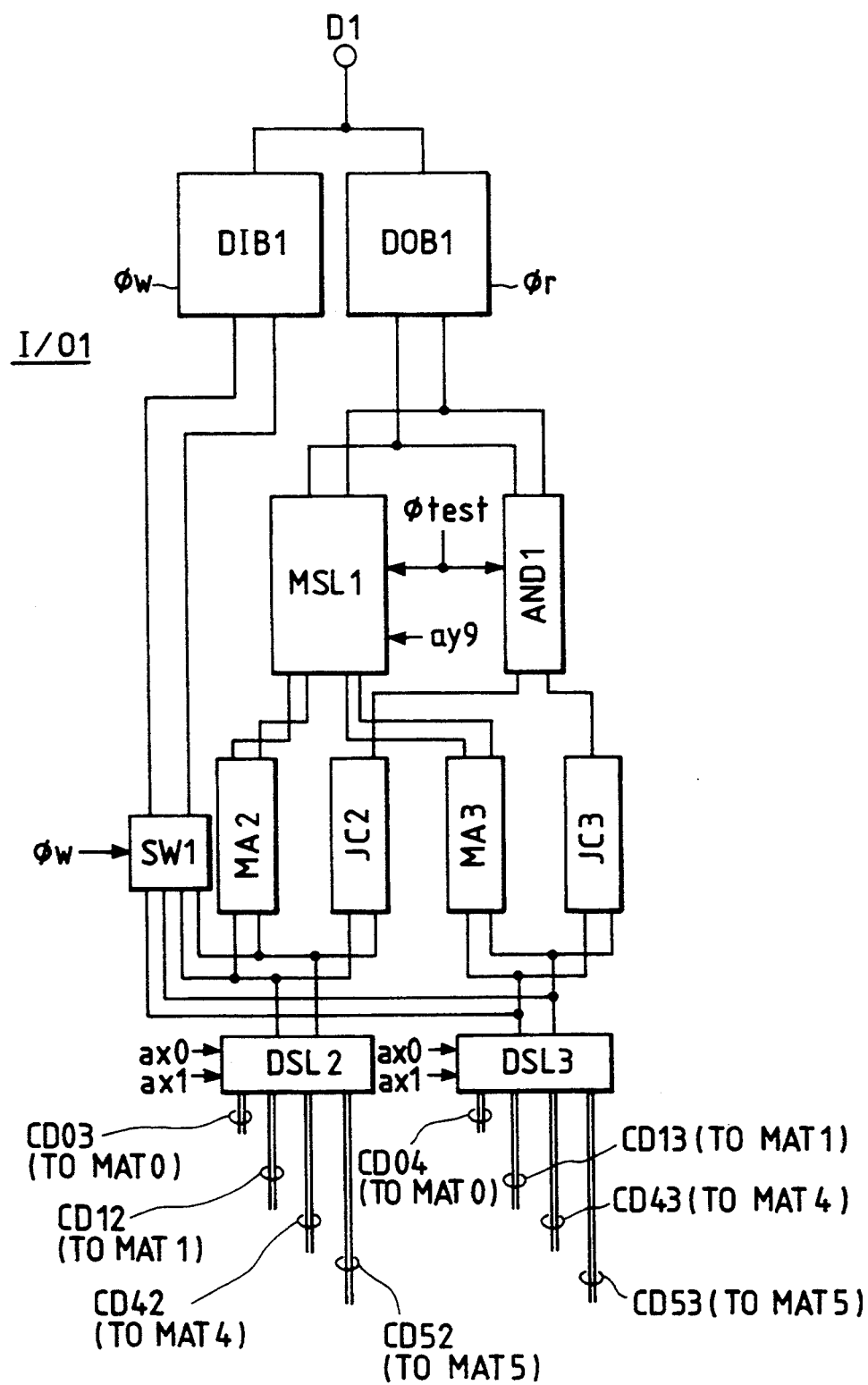
FIG. 7B is a connection diagram between an input-/output circuit 91 and a memory mat group 8 shown in FIG. 5.
Figure 7C:
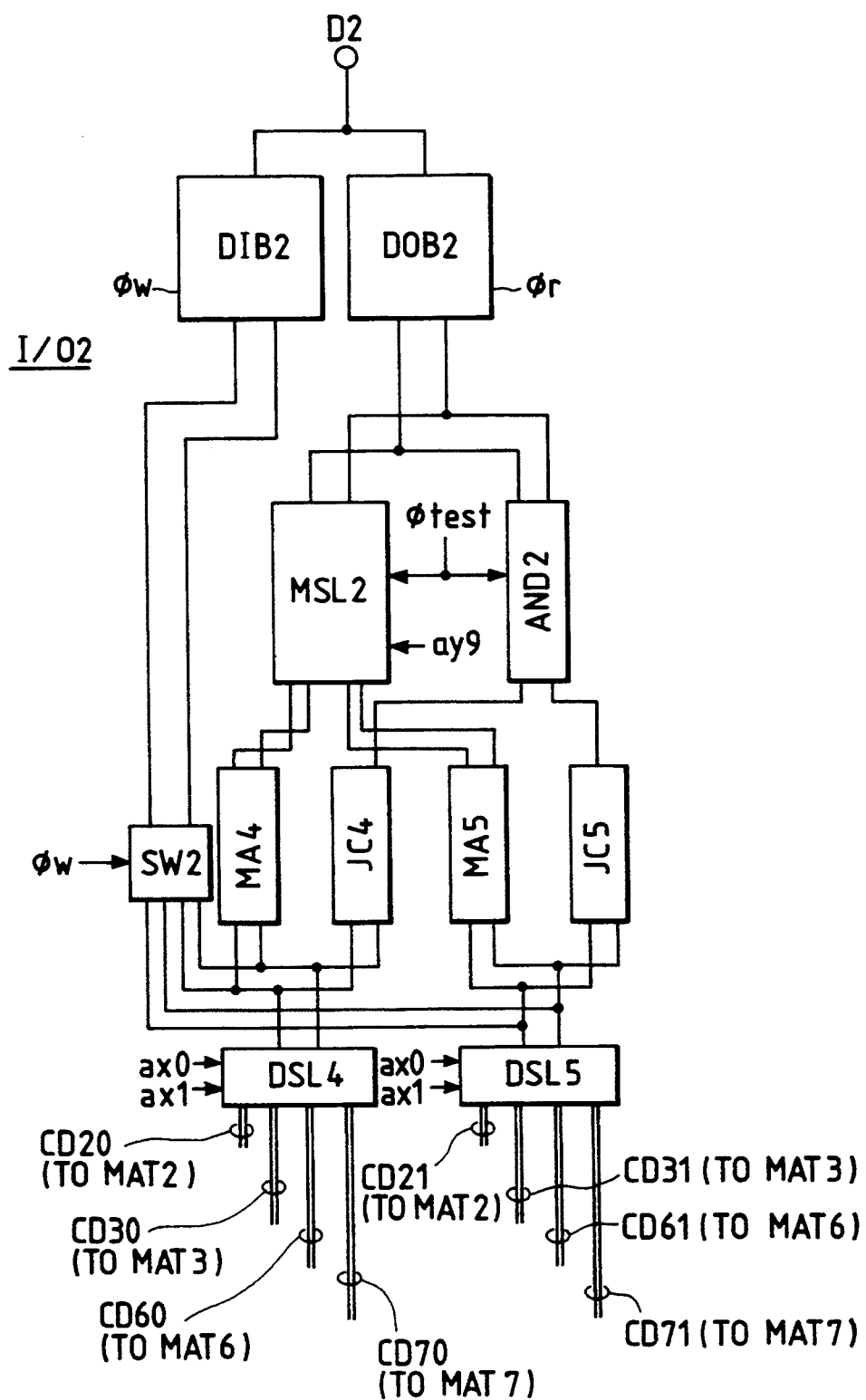
FIG. 7C is a connection diagram between an input-/output circuit 92 and a memory mat group 8 shown in FIG. 5.
Figure 7D:
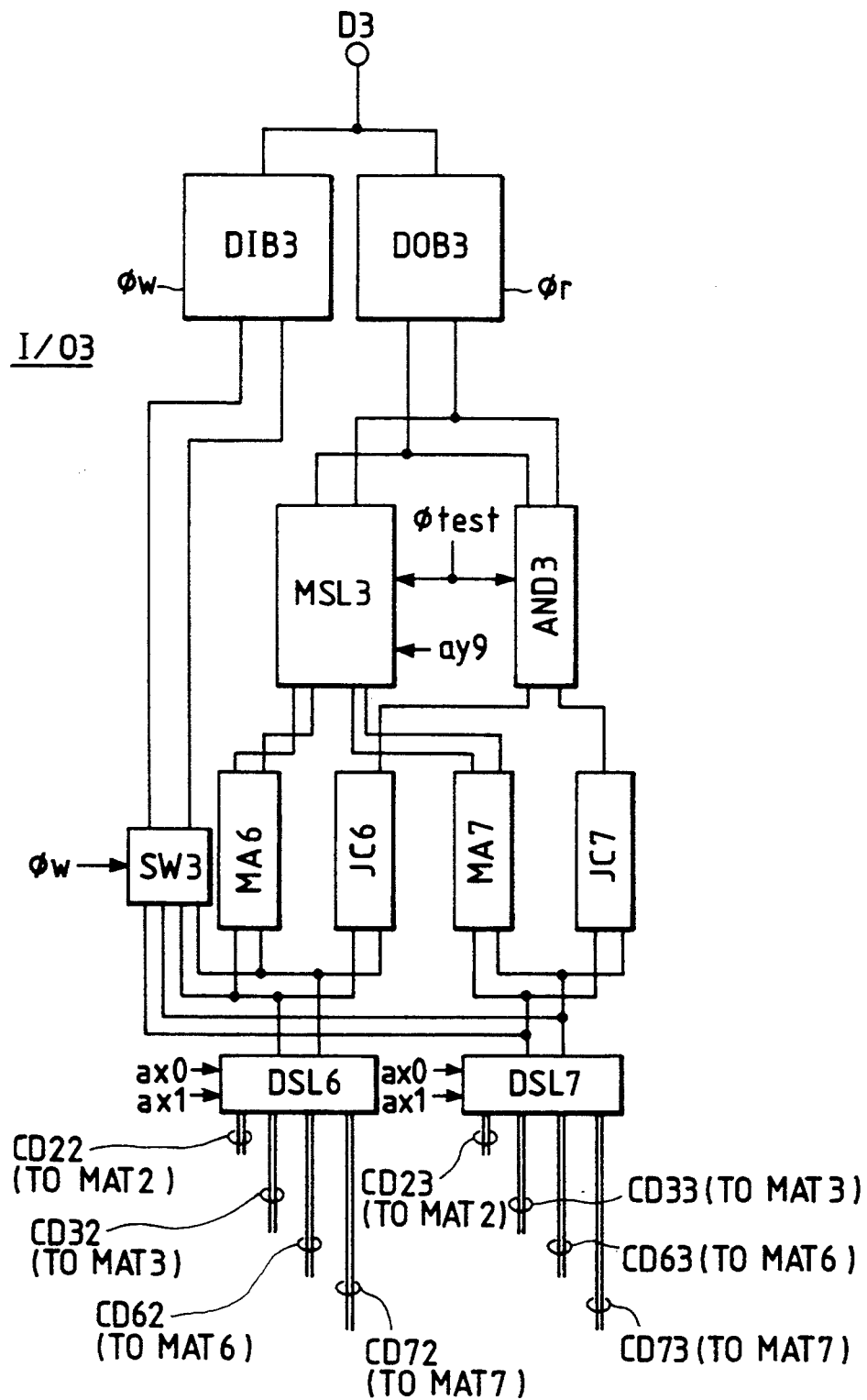
FIG. 7D is a connection diagram between an input-/output circuit 93 and a memory mat group 8 shown in FIG. 5.

FIG. 5 is a block diagram showing the inside of a chip of a semiconductor memory device to which the present invention is applied. The semiconductor memory device of this embodiment is provided with external data terminals D0-D3 for inputting or outputting data of 4 bits, and input/output circuits 90-93 for processing the input and output data corresponding to the external data terminals D0-D3. The internal constitution of the address signal processing circuit 6 and the timing generator 7 are shown in FIG. 1. A memory mat group 8 includes eight memory mats MAT0-MAT7.

In FIG. 5, the internal constitution of the input/output circuit 90 shown as a representative example will be described as follows. In the normal read operation, data selectors DSL0 and DSL1 select and output a pair of complementary signals from four pairs of complementary input signals respectively. Each complementary signal is amplified in main amplifiers MA0 and MA1, respectively. One amplified signal of these amplified signals is selected by a main amplifier selector MSL0, and is sent through a data output buffer DOB0 to the external terminal D0. Also in the normal write operation, the write data applied to the external terminal D0 pass through the data input buffer DIB0 and the switch circuit SW, and the same write complementary signal is supplied to the data selectors DSL0 and DSL1. The write complementary signal is sent to the selected complementary signal lines, respectively.

Next in the test operation state, a pair of test signals outputted respectively from the data selectors DSL0 and DSL1 are decided by decision circuits JC0 and JC1. Each decision circuit includes an exclusive OR circuit to which the pair of test signals are inputted. If the pair of signals are complementary signals, the decision is made that the signals are normal, and the decision signals of high level are outputted from the decision circuit. If the signals are at the same level, the decision is made that the signals are abnormal, and the decision signals of low level are outputted from the decision circuit. The output signal of each decision circuit is inputted to an AND circuit AND0. The AND circuit AND0 forms the final decision signal of high level, only when the decision results of both decision circuits JC0 and JC1 are normal, that is, when both decision signals are at high level. The final decision signal is sent through the data output buffer DOB0 to the external terminal D0.

FIGS. 6A-6D show the constitution of the memory mats MAT0-MAT7. Each memory mat has two memory cell arrays, and a row decoder, a sense amplifier and a column switch are provided corresponding to each memory cell array. One column decoder is provided for the two memory cell arrays. Two memory mats selected among the eight memory mats MAT0-MAT7 are put in the operation state. That is, one among the sense amplifier drive signals $\phi$sa0-$\phi$sa3 is put in the selective state, whereby the two memory mats with the drive signal applied thereto are selected. In the normal read operation, the read data of 4 bits are obtained respectively from each selected memory mat. For example, if the sense amplifier drive signal $\phi$sa0 is put in the selective state, the read complementary signals of 8 bits in total are formed in the common data line pairs CD00-CD03 and CD20-CD23 of the memory mats MAT0 and MAT2. Also in the multiple bit test mode, the test information of eight pieces in total are formed in the common data line pairs.

FIGS. 7A-7D show how the input/output circuits 90, 91, 92 and 93 shown in FIG. 5 and the memory mats MAT0-MAT7 shown in FIGS. 6A-6D are connected through the common data line pairs CD00-CD03, CD10-CD13, CD20-CD23, CD30-CD33, CD40-CD43, CD50-CD53, CD60-CD63 and CD70-CD73.

Figure 8:
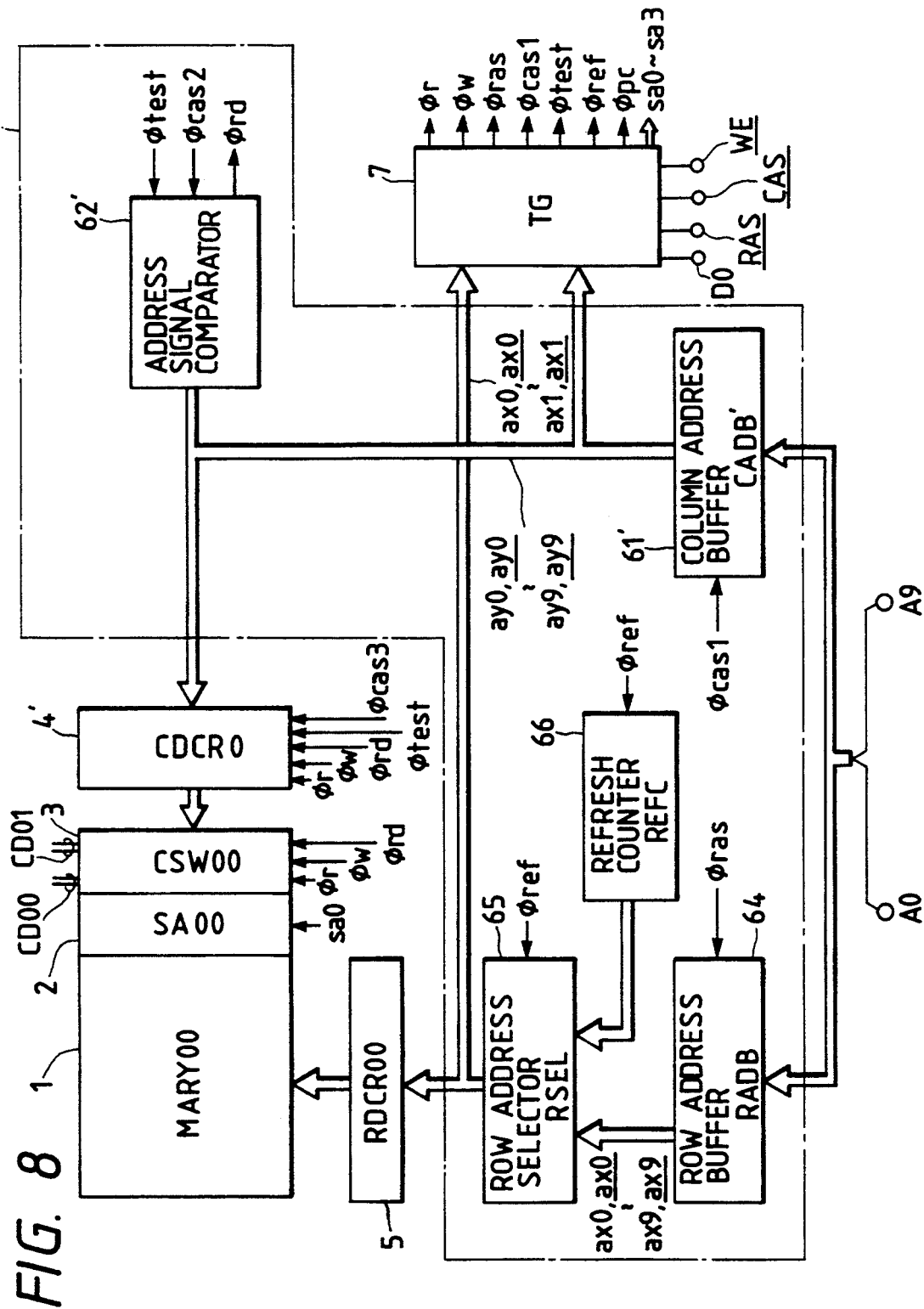
FIG. 8 is a block diagram of a memory to which the invention is applied.

FIG. 8 shows another embodiment of the present invention. A column address selector 63 is omitted in FIG. 8, unlike the embodiment shown in FIG. 1. Also the address comparing/forming circuit 62 in FIG. 1 is replaced by an address signal comparator 62' in FIG. 8.

Figure 9:
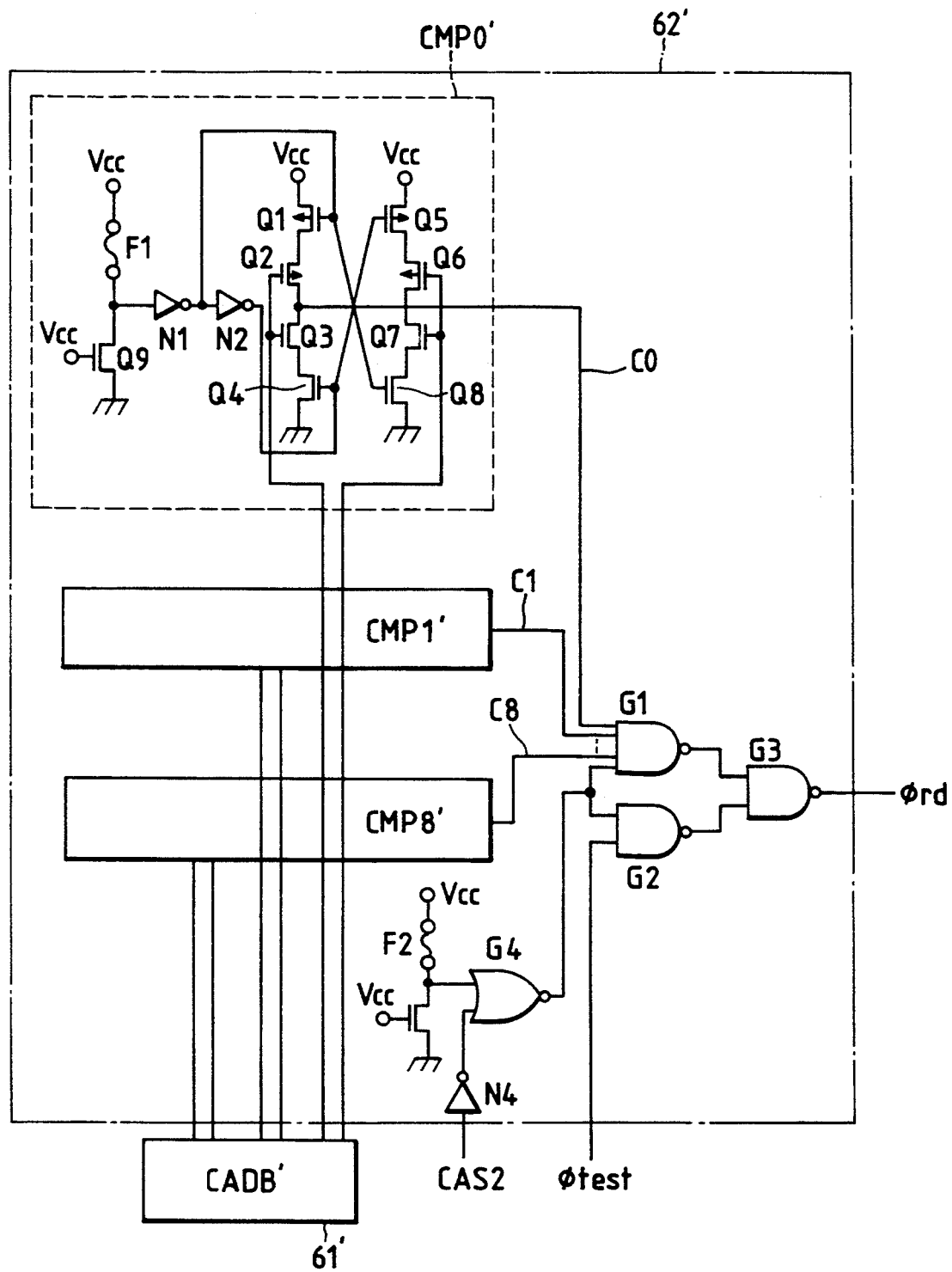
FIG. 9 is a circuit diagram of an address signal comparator 62' shown in FIG. 8.

FIG. 9 shows the internal constitution of a column decoder 4' shown in FIG. 8. Unlike the embodiment shown in FIG. 2, the defective address signals Af0-Af8 are not sent to the column decoder side. Also in this embodiment, the complementary address signals formed in a column address buffer 61' are supplied directly to respective unit comparators CMP0'-CMP8'.

Figure 10:
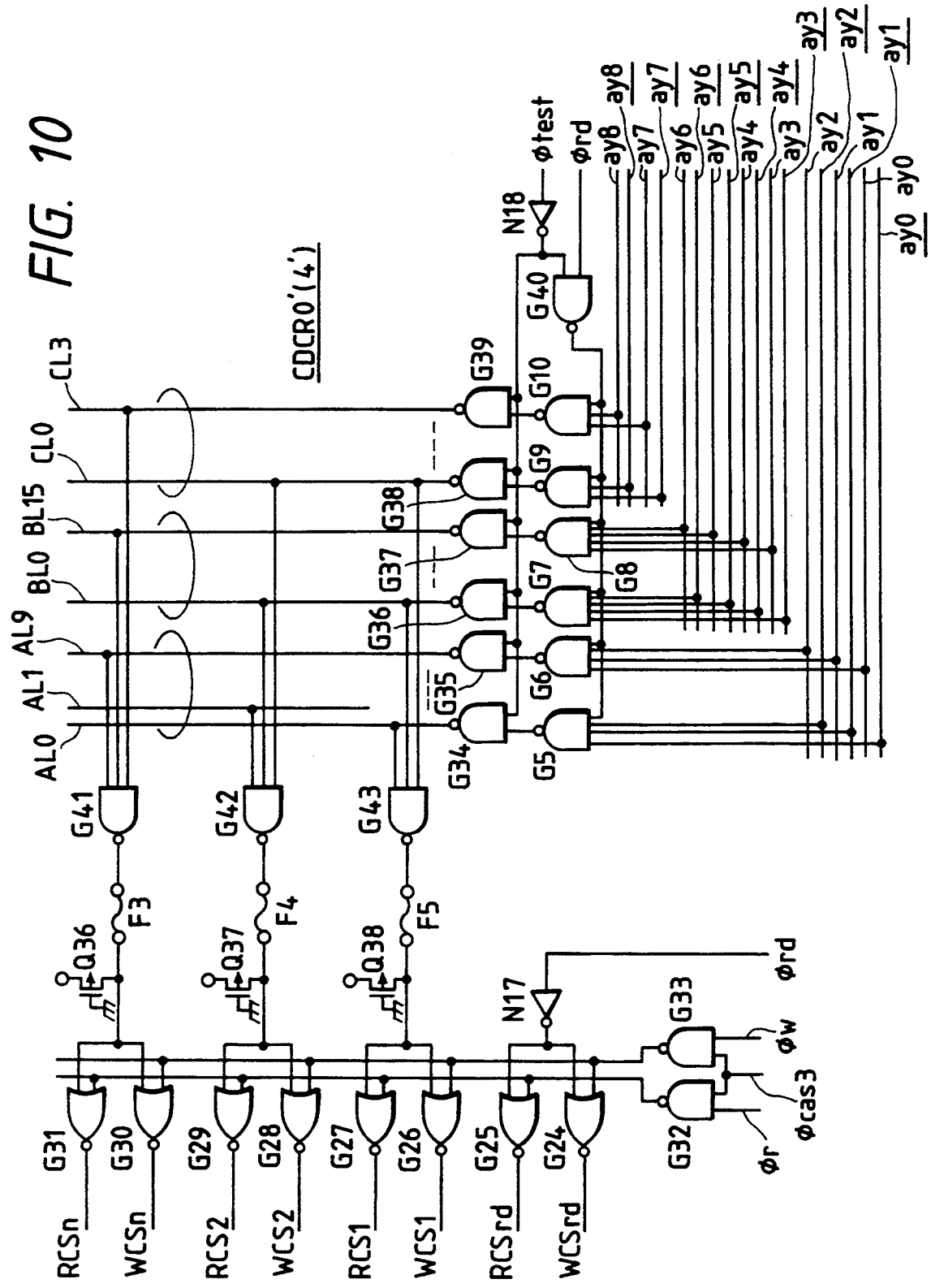
FIG. 10 is a circuit diagram of a column decoder 4' shown in FIG. 8.

FIG. 10 shows the internal constitution of a column decoder 4' shown in FIG. 8. Unlike the embodiment shown in FIG. 3, fuse elements F3-F5 are installed. MOS transistors Q36-Q38 installed between one end of each fuse element F3-F5 and the power source voltage terminal Vcc are equivalent to high resistance element, and form pull-up means. That is, when a fuse element corresponding to a defective data line is broken, one end of the fuse element is fixed to the Vcc level, thereby the floating state is prevented. For example, if the fuse element F3 is broken, since one input signal of the NOR gates G30 and G31 is fixed to high level, the column switch selecting signals RCSn and WCSn are fixed to the non-selection state of low level. In this case, the fuse element can be broken selectively by a laser beam or the like.

The column decoder 4' shown in FIG. 10 is provided with NAND gates G34-G39, in place of the inverters N5-N10 in the column decoder 4 in FIG. 3. An inverter N18 is installed in order to apply the inverted signal of the test control signal $\phi$test to input terminals of these NAND gates G34-G39. Also a NAND gate G40 has the redundant data line selecting signal $\phi$rd and the inverted signal of the test control signal $\phi$test as input signals, and output signal of the NAND gate G40 is applied to each input terminal of the NAND gates G5-G10. The column decoder 4' shown in FIG. 10 performs operation corresponding to 4 sorts of operation modes in response to values of the redundant data line selecting signal $\phi$rd and the test control signal $\phi$test in similar manner to the column decoder 4 shown in FIG. 3.

The first operation mode is a mode where selection of redundant data lines is not carried out and usual read or write operation is carried out. In this mode, both the redundant data line selecting signal $\phi$rd and the test control signal $\phi$test are made low level. In the first operation mode, one of the selecting signals (RCS1-RCSn) or (WCS1-WCSn) to control the column switch coupled with normal data lines is set at a selection state of high level.

Next, the second operation mode is a mode where selection of redundant data lines is carried out and normal read or write operation is carried out. In this mode, the redundant data line selecting signal $\phi$rd is made high level and the test control signal $\phi$test is made low level. In the second operation mode, the selecting signal (RCSrd) or (WCSrd) to control the column switch coupled with redundant data lines is set at a selection state of high level.

Next, the third operation mode is a mode where selection of redundant data lines is not carried out and the multiple bit test operation is carried out. In this mode, the redundant data line selecting signal $\phi$rd is made low level, and the test control signal test is made high level. In the third operation mode, the selecting signals (RCS1-RCSn) or (WCS1-WCSn) to control the column switch coupled with normal data lines are all made selection state of high level.

Next, the fourth operation mode is a mode where selection of redundant data lines is carried out and the multiple bit test operation is carried out. In this mode, both the redundant data line selecting signal $\phi$rd and the test control signal $\phi$test are made high level.

In the fourth operation mode, the selecting signals (RCSrd) or (WCSrd) to control the column switch coupled with the normal data lines, excluding the selecting signals to control the column switch corresponding to the defective data lines, are all made selection state of high level. At the same time, the selecting signal (RCSrd) or (WCSrd) to control the column switch coupled with the redundant data lines is made selection state of high level.

In this embodiment, the fuse corresponding to the defective data line is previously broken, thereby the defective data line is always made non-selection state. Consequently, the circuit to form the non-selection state is simplified.

Figure 11:
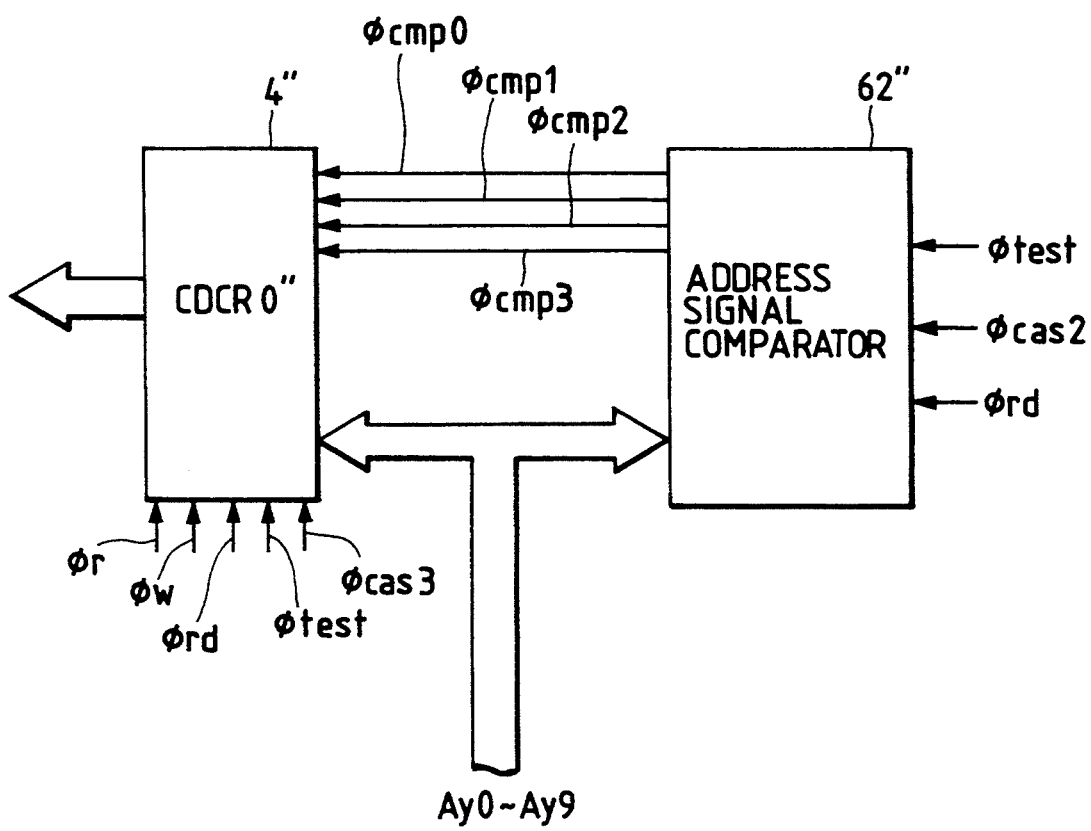
FIG. 11 is a block diagram of a part of a memory to which the invention is applied.

FIG. 11 shows another embodiment of the present invention, and main part being different from the embodiment in FIG. 8 is partly shown. In the embodiment shown in FIG. 11, selecting signals $\phi$cmp0, $\phi$cmp1, $\phi$cmp2 and $\phi$cmp3 are supplied from an address signal comparator 62" to a column decoder 4". These selecting signals $\phi$cmp0, $\phi$cmp1, $\phi$cmp2 and $\phi$cmp3 are formed based on the defective address signals Af7 and Af8, and any one of the selecting signals is made high level. When a defective data line exists, it is shown by the selecting signal that defective data line exists to which group of data lines divided into 4 groups.

Figure 12:
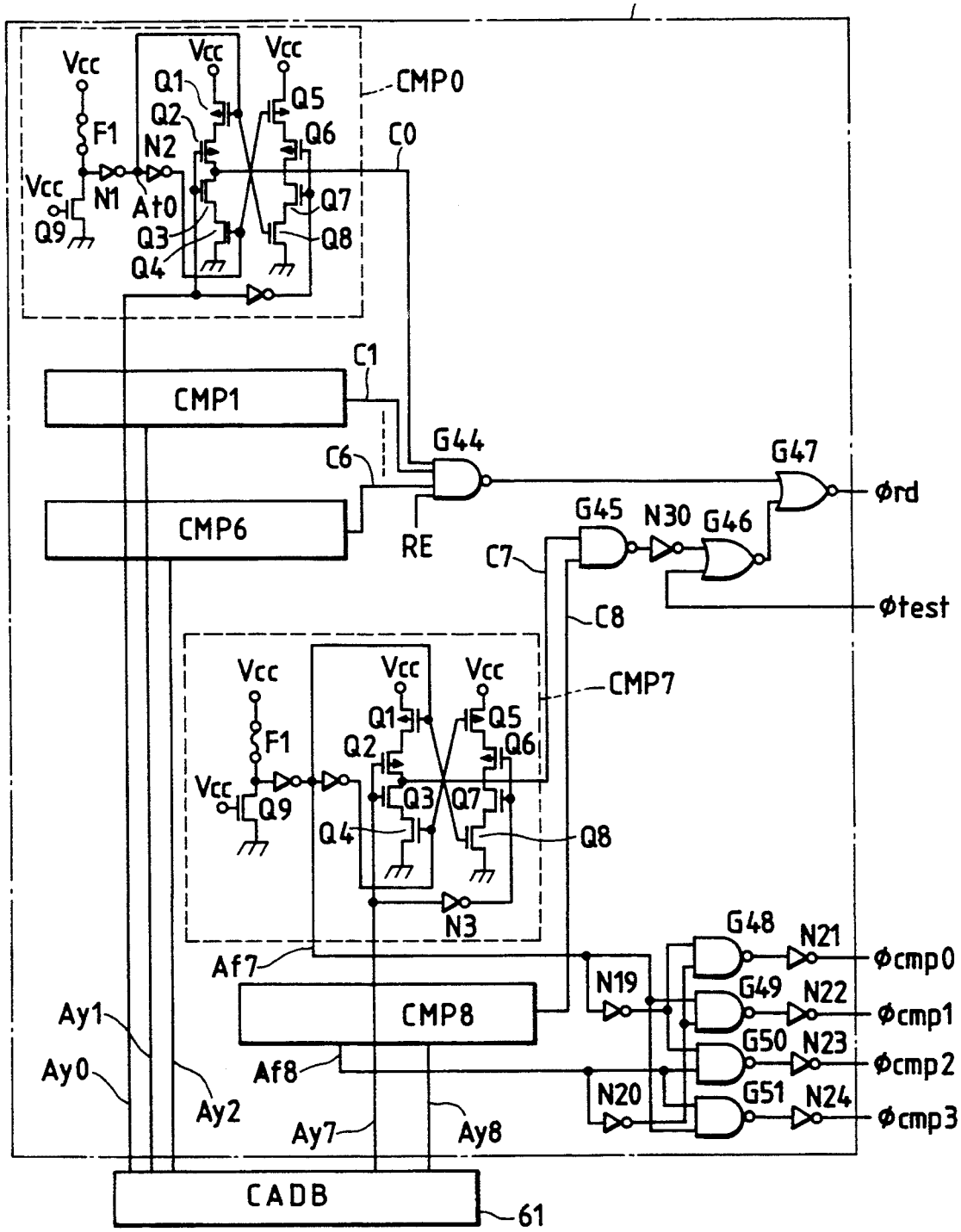
FIG. 12 is a circuit diagram of an address signal comparator 62" shown in FIG. 11.

FIG. 12 shows internal circuits of the address signal comparator 62". Unlike the embodiment shown in FIG. 2, gate circuits G48-G51 and inverters N19-N24 are installed in order to form the selecting signals $\phi$cmp0, $\phi$cmp1, $\phi$cmp2 and $\phi$cmp3. Also gate circuits G44-G47 and an inverter N30 are installed in order to form a redundant data line selecting signal $\phi$rd. When the redundant enable signal RE is high level and input address signals Ay0-Ay8 are coincident with defective address signals Af0-Af8, the redundant data line selecting signal $\phi$rd is made selection state of high level. Also when the redundant enable signal RE is high level and input address signals Ay0-Ay6 are coincident with defective address signals Af0-Af6, the redundant data line selecting signal $\phi$rd is set at a selection state of high level provided that the test control signal $\phi$test is made high level. In this embodiment, the multiple bit test is carried out for four data lines being selectable alternatively by the address signals Af7 and Af8. That is, provided that these four data lines do not include any defective data line, these four data lines are coupled with one common data line simultaneously. If one of these four data lines is a defective data line, the three data lines excluding the defective data line, and the redundant data line are coupled with one common data line simultaneously. The input address signals Ay0-Ay6 are coincident with the defective address signals Af0-Af6, whereby it is detected that one of the four data lines is a defective data line. Unless the input address signals Ay0-Ay6 are coincident with the defective address signals Af0-Af6, since it is indicated that the four data lines do not include a defective data line, the four data lines are coupled with one common data line simultaneously. In this case, the redundant data line selecting signal $\phi$rd is set at a non-selection state of low level.

Figure 13:
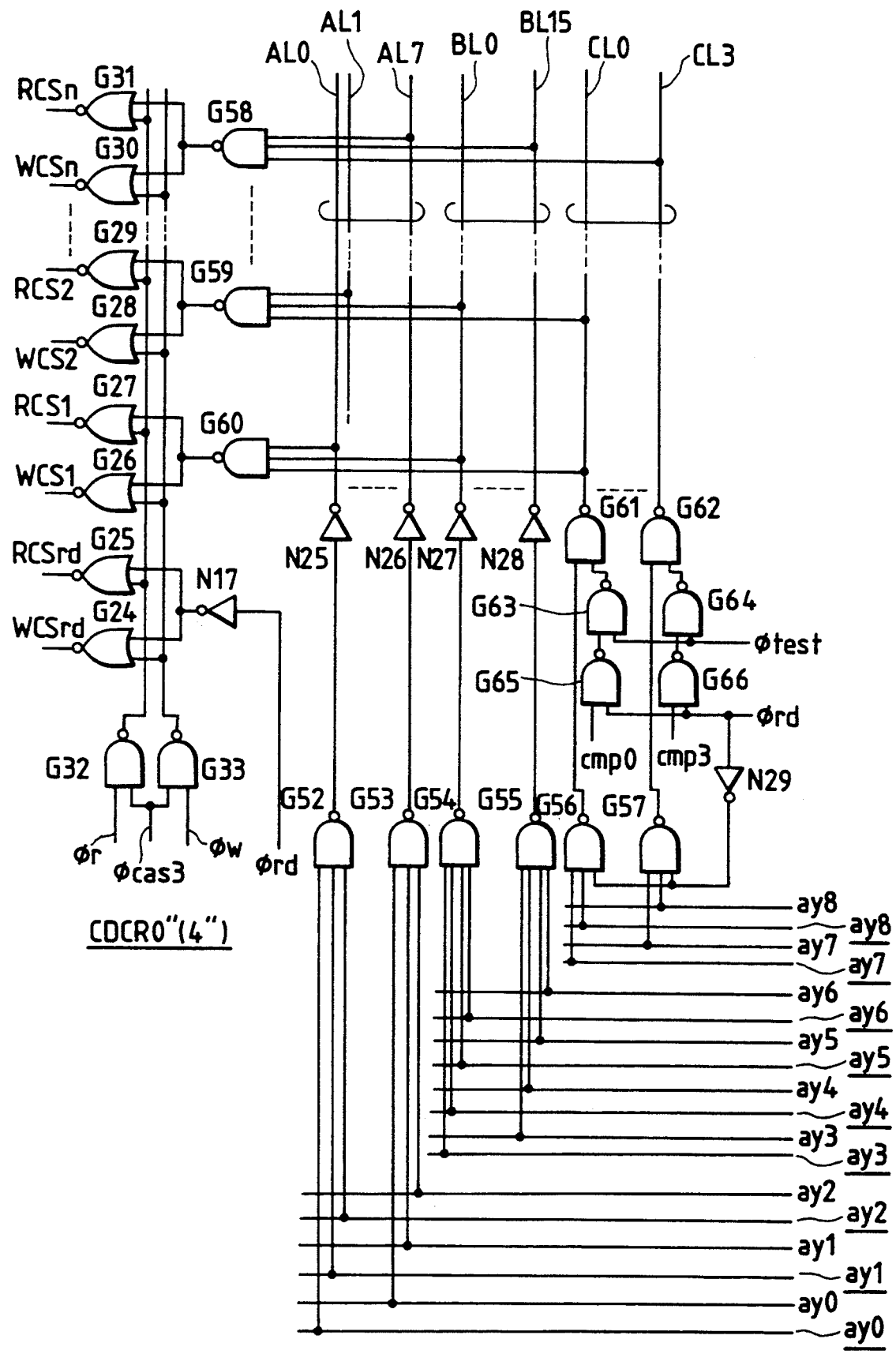
FIG. 13 is a circuit diagram of a column decoder 4" shown in FIG. 11.

FIG. 13 shows internal circuits of the column decoder 4" shown in FIG. 11. Gate circuits G61-G66 are installed in order to form drive signals for signal lines CL0-CL3. The column decoder 4" performs operation corresponding to four sorts of operation modes in response to values of the redundant data line selecting signal $\phi$rd and the test control signal $\phi$test.

The first operation mode is a mode where selection of redundant data lines is not carried out and usual read or write operation is carried out. In this mode, both the redundant data line selecting signal $\phi$rd and the test control signal $\phi$test are made low level. As a result, any one of the signal lines CL0-CL3 is selected based on the complementary address signals (af7, af7) and (af8, af8) formed from the address signals Af7 and Af8. In the first operation mode, one of the selecting signals (RCS1-RCSn) or (WCS1-WCSn) to control the column switch coupled with normal data lines is set at a selection state of high level.

Next, the second operation mode is a mode where selection of redundant data lines is carried out and normal read or write operation is carried out. In this mode, the redundant data line selecting signal $\phi$rd is made high level and the test control signal $\phi$test is made low level. As a result, the signal lines CL0-CL3 are all set at a non-selection state of low level. In the second operation mode, the selecting signal (RCSrd or WCSrd) to control the column switch coupled with redundant data lines is set at a selection state of high level.

Next, the third operation mode is a mode where selection of redundant data lines is not carried out and the multiple bit test operation is carried out. In this mode, the redundant data line selecting signal $\phi$rd is made low level, and the test control signal $\phi$test is made high level. As a result, the signal lines CL0-CL3 are all set at a selection state of high level. In the third operation mode, among the selecting signals (RCS1-RCSn or WCS1-WCSn) to control the column switch coupled with normal data lines, four selecting signals selected by the address signals Ay0-Ay6 are set at a selection state of high level.

Next, the fourth operation mode is a mode where selection of redundant data lines is carried out and the multiple bit test operation is carried out. In this mode, both the redundant data line selecting signal $\phi$rd and the test control signal $\phi$test are made high level. As a result, in response to the signals $\phi$cmp0, $\phi$cmp1, $\phi$cmp2 and $\phi$cmp3, three signal lines among the signal lines CL0-CL3 are set at a selection state of high level. In the fourth operation mode, among the selecting signals (RCS1-RCSn) to control the column switch coupled with normal data lines, three selecting signals selected by the address signals Ay0-Ay6, excluding selecting signals to control the column switch coupled with the defective data lines, are set at a selection state of high level. Also the selecting signal RCSrd or WCSrd to control the column switch coupled with the redundant data lines is set at a selection state of high level.

Figure 14:
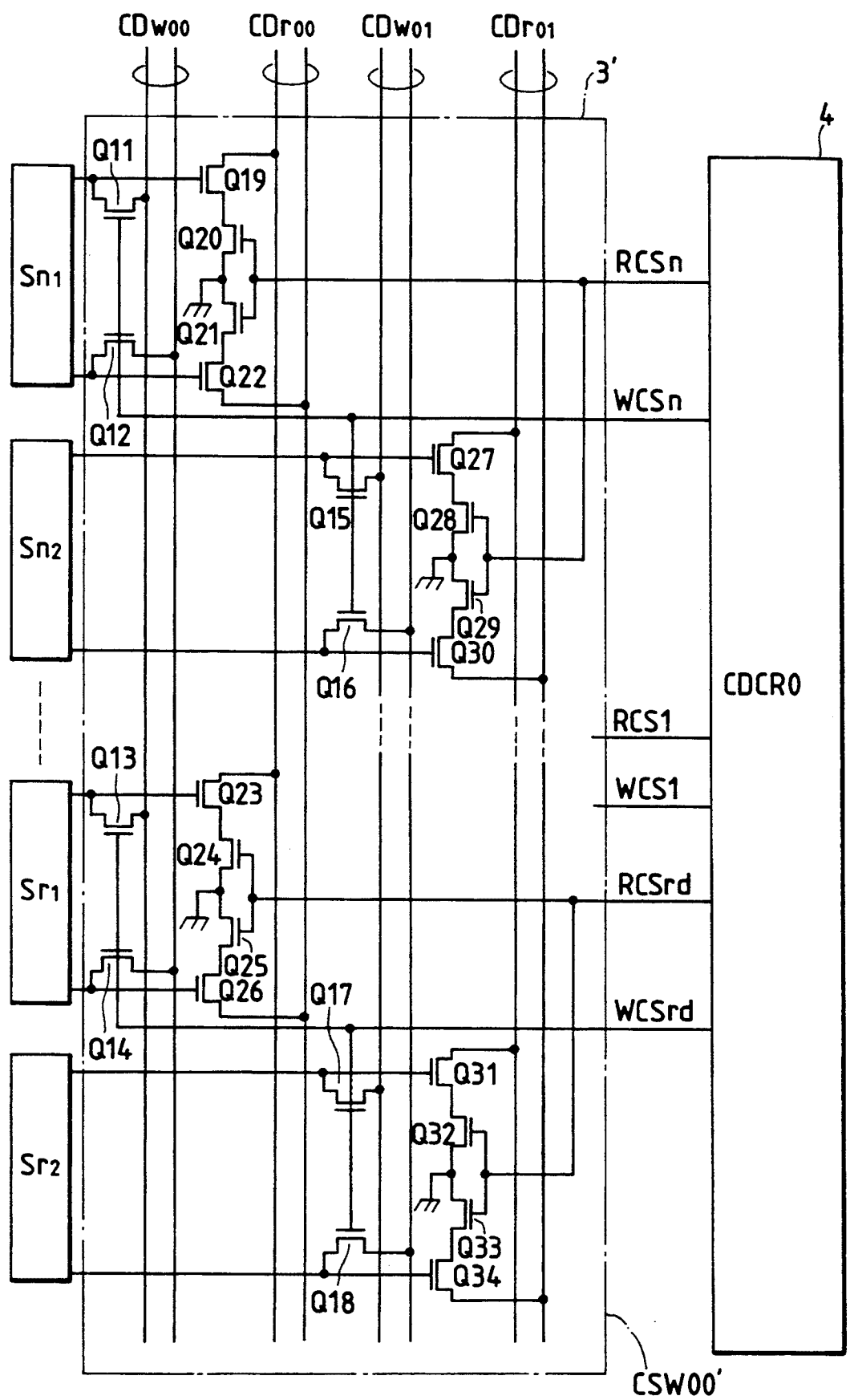
FIG. 14 is an example of an inner circuit diagram of a column switch 3 shown in FIG. 8.

FIG. 14 shows constitution of a column switch 3'. Unlike the column switch 4 shown in FIG. 4, common data lines CDr00, CDr01 for reading and common data lines CDw00, CDw01 for writing are installed independently. Since the common data lines are separated in this manner, parasitic capacitance coupled with each common data line can be reduced. Accordingly, the read and write operations can be performed at high speed.

Figure 16:
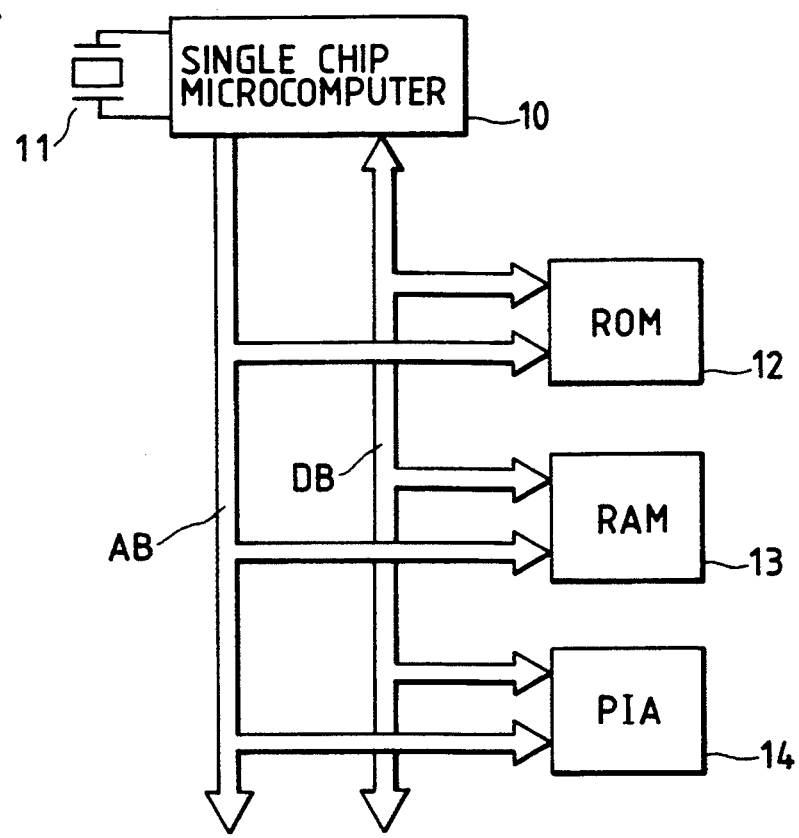
FIG. 16 shows a microcomputer system using a memory to which the invention is applied.

FIG. 16 shows a microcomputer system using a memory to which the present invention is applied. The invention is applied to a random access memory 13, which is coupled with a single chip microcomputer 10 through an address bus AB and a data bus DB. A crystal resonator 11, a read only memory 12, a peripheral interface adapter 14 or the like may be installed if necessary.

Figure 17:
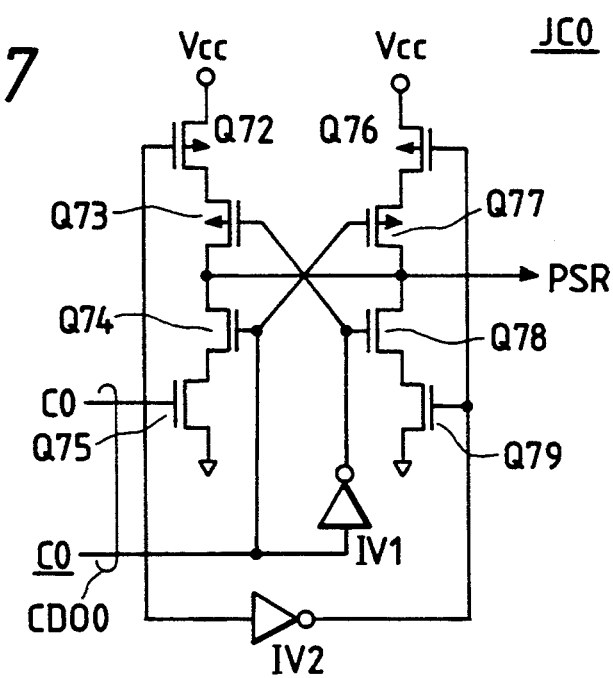
FIG. 17 is a circuit diagram of an embodiment of a decision circuit JCO shown in FIG. 5.

FIG. 17 shows a circuit diagram of an embodiment of a decision circuit JC0 shown in FIG. 5. The following operation is performed in the case where the complementary common data line pair CD00 shown in FIG. 4 is selected by the data selector DSL0 shown in FIG. 5 and coupled with the decision circuit JC0.

P-channel MOSFETs Q72 and Q73 and N-channel MOSFETs Q74 and Q75 are connected in series. Also series circuit composed of P-channel MOSFETs Q76 and Q77 and N-channel MOSFETs Q78 and Q79 is installed.

Gate of the N-channel MOSFET Q74 and the P-channel MOSFET Q77 is supplied with other signal C0 of the complementary common data line pair CD00, and gate of the MOSFET Q73 and the MOSFET Q78 is supplied with the signal C0 inverted by an inverter IV1.

In the circuit of this embodiment, if both signals C0, C0 are high level or low level, the output signal of low level is formed. If one of the signals C0, C0 is high level and the other is low level, the output signal PSR of high level is formed.

In this embodiment, before the start of the high speed read test according to the multiple bit parallel test mode of the present invention, the same storage information is written in all memory cells connected to the same common data line during other bit parallel test. For example, the write operation in one bit unit is used, or the simultaneous writing is performed to all memory cells coupled with one word line, or the sense amplifier is operated in the simultaneous writing state and the word lines are changed one by one utilizing the address start-stop operation in the refresh mode, thereby the same storage information is written in all bits at high speed. In this case, if high level (logic 1) is written from the external terminal D0, high level is stored in the information storage capacitor of the memory cell coupled with the non-inverted data lines (Dn1, Dr1), and low level is stored in the information storage capacitor of the memory cell coupled with the inverted data lines (Dn1, Dr1).

Next, the multiple bit parallel test mode is started, and if one word line is selected, the storage information of the memory cell coupled thereto appears at one side of the complementary data lines, and the complementary data lines are made high level or low level by amplifying operation of the sense amplifier SA. As a result, for example, if the non-inverted data lines (Dn1, Dr1) are high level and the inverted data lines (Dn1, Dr1) are low level, in FIG. 4, the MOSFETs Q19 and Q23 are turned on, and the MOSFETs Q22 and Q26 are turned off. Consequently, the signal C0 becomes low level, and other signal C0 is held to high level. Thereby the decision circuit JC0 makes the output PSR signal of high level. This means that signals of all bits read from the memory cells coupled with the word lines simultaneously are coincident. On the contrary, among the pair of complementary data lines, if even one of the inverted data lines is made high level, the MOSFET is turned on in response to this. Therefore, the signal C0 corresponding to this becomes low level. Consequently, the decision circuit JC0 makes the output PSR signal of low level. Thereby it can be detected that an erroneously read signal exists among the storage information of the memory cells coupled with the word lines. The detected signal PSR is outputted through the data output buffer DOB from the external terminal D0. In such output system, the read test can be performed in the state that the RAM is installed on the mounting substrate such as print board.

According to the above-mentioned embodiments, functional effects can be obtained as follows.

(1) In the column decoder 4, the first decoder 41 to decode defective address signals is installed, whereby signals to assign defective data lines can be formed. Consequently, a plurality of data lines excluding defective data lines can be selected simultaneously by the second control circuit 44. Therefore, even if the defective data line exists, the multiple bit test can be carried out. That is, the redundancy function and the multiple bit test function are compatible.

(2) In the column decoder 4', due to fuse elements F3-F to set the defective address signal into a non-selection state stably, the defective address signal need not be decoded. Accordingly, the circuit constitution of the column decoder is simplified. Further, signal lines to supply the defective address signal to the column decoder 4' need not be installed.

(3) In the column decoder 4'', the gate circuits G61-G66 are installed to perform full selection, full non-selection, alternative selection of signal lines CL0-CL3, or selection of three signal lines excluding a signal line corresponding to a defective data line, whereby the redundancy function and the multiple bit test function are compatible. Further, the number of the data lines coupled with the common data line using the multiple bit test can be limited to four. Since the parasitic capacitance of the data lines coupled with the common data line can be limited, decrease of the voltage value of the decision signal appearing on the common data line can be prevented. As a result, the detection accuracy of the level of the decision signal is improved, whereby the multiple bit test with high accuracy becomes possible.

Further, using the multiple bit test, the data lines coupled with the common data line simultaneously can be distributed. That is, the data lines being not adjacent to each other may be selected simultaneously. Thereby the limitation to the write data pattern can be substantially eliminated. Consequently, various testing data patterns can be used to detect error due to interference of held data between adjacent memory cells. Therefore, the error detection capacity is improved.

Although the invention by the inventor has been described specifically based on preferred embodiments, it is understood that the invention is not limited to the embodiments but various changes and modifications may be made without departing from the spirit and scope of the invention.

The semiconductor memory device of the embodiment may be provided with a plurality of test modes. That is, one data line may be coupled with each of the common data lines, and test modes to detect coincidence or non-coincidence of decision signals appearing on these common data lines may be provided within the semiconductor memory device. In this case, selection of the test modes is possible by making specific combination of the level of the external address terminals A0, A1 in the timing chart shown in FIG. 15.

The utilization field of the present invention is not limited to dynamic RAMs, but may be various memories, such as pseudo-static RAMs, static RAMs or the like.

Effects obtained by the typical invention among those disclosed in the present patent application will be briefly described as follows.

The multiple bit test of the semiconductor memory device having redundant data lines becomes possible, whereby reduction of the test time can be attained.

What is claimed is:

1. A semiconductor memory device comprising:
   a plurality of data lines;
   a redundant data line;
   a plurality of memory cells corresponding to said data lines and said redundant data line, respectively;
   a common data line coupled through switch circuits respectively corresponding to said data lines and said redundant data line; and
   control means for rendering one or plural switch circuits to the ON-state,
   wherein said control means renders a first switch circuit corresponding to said redundant data line to the ON-state during a normal read operation, and renders said first switch circuit and said plural switch circuits, except a second switch circuit corresponding to a data line replaced by said redundant data line, to the ON-state during a test operation.

2. A semiconductor memory device according to claim 1, wherein said control means comprises a first address signal forming circuit for specifying data lines to be replaced, and a decoder for receiving first address signal from the first address signal forming circuit.

3. A semiconductor memory device according to claim 1, wherein said control means is provided with fuses installed corresponding to control signal lines for each of the switch circuits, and wherein the fuses are selectively broken so that the second switch circuit corresponding to the data line to be replaced is turned off.

4. A semiconductor memory device according to claim 2, wherein a part of the first address signal to be inputted to said decoder is subjected to logic processing, so that the switch circuits corresponding to a plurality of data lines, excluding the data line to be replaced and the redundant data line are turned on.

5. A semiconductor memory device comprising:
   a plurality of complementary data line pairs;
   a complementary redundant data line pair;
   a plurality of memory cells corresponding to said complementary data line pairs and said complementary redundant data line pair, respectively;
   a common data line pair coupled through switch circuits corresponding to said complementary data line pairs and said redundant data line pair; and
   control means for rendering one or plural switch circuits to the ON-state,
   wherein said control means renders one a first switch circuit corresponding to the complementary redundant data line pair to the ON-state during a normal read operation, and renders said first switch circuit and a plurality of said switch circuits, except a second switch circuit corresponding to a complementary data line pair replaced by said complementary redundant data line pair, to the ON-state during a test operation.

6. A semiconductor memory device according to claim 5, comprising a circuit coupled with said common data line pair for detecting coincidence or non-coincidence of a signal appearing on said common data line pair.

7. A semiconductor memory device comprising:
   a plurality of data lines;
   a redundant data line;
   a plurality of memory cells corresponding to said data lines and said redundant data line, respectively;
   a common data line coupled through switch circuits respectively corresponding to said data lines and said redundant data line; and
   control means for rendering one or plural switch circuits to the ON-state,
   wherein said control means renders a first switch circuit corresponding to said redundant data line to the ON-state during a normal read operation, and renders said first switch circuit and said plural switch circuits, except a second switch circuit corresponding to a data line replaced by said redundant data line, to the ON-state during a test operation so that a plurality of data lines and said redundant data line can be tested simultaneously without testing the data line replaced by the redundant data line.

8. A semiconductor memory device according to claim 7, wherein said control means comprises a first address signal forming circuit for specifying data lines to be replaced, and a decoder for receiving the first address signal.

9. A semiconductor memory device according to claim 7, wherein said control means is provided with fuses installed corresponding to control signal lines for each of the switch circuits, and wherein the fuses are selectively broken so that the second switch circuit corresponding to the data line to be replaced is turned off.

10. A semiconductor memory device according to claim 8, wherein a part of the first address signal to be inputted to said decoder is subjected to logic processing, so that the switch circuits corresponding to a plurality of data lines, excluding the data line to be replaced, and the redundant data line are turned on.

* * * * *